（12）United States Patent
Villemoes

(10) Patent No.: US 8,315,859 B2
(45) Date of Patent: *Nov. 20, 2012

(54) EFFICIENT FILTERING WITH A COMPLEX MODULATED FILTERBANK

(75) Inventor: Lars Villemoes, Jaerfaella (SE)

(73) Assignee: Dolby International AB, Amsterdam Zuid-Oost (NL)

( * ) Notice: Subject to any disclaimer, the term of this patent is extended or adjusted under 35 U.S.C. 154(b) by 281 days.

This patent is subject to a terminal disclaimer.

(21) Appl. No.: 12/726,307

(22) Filed: Mar. 17, 2010

(65) Prior Publication Data

US 2010/0174767 A1      Jul. 8, 2010

Related U.S. Application Data

(62) Division of application No. 11/469,790, filed on Sep. 1, 2006, now Pat. No. 7,711,552.

(60) Provisional application No. 60/744,559, filed on Apr. 10, 2006, provisional application No. 60/762,592, filed on Jan. 27, 2006.

(51) Int. Cl.
*G10L 21/00* (2006.01)

(52) U.S. Cl. ........ 704/220; 704/200; 704/203; 704/224; 381/316

(58) Field of Classification Search .................. 704/200, 704/203, 220, 224; 381/316
See application file for complete search history.

(56) References Cited

U.S. PATENT DOCUMENTS

| | | | |
|---|---|---|---|
| 5,327,366 A | 7/1994 | Mau | |
| 5,848,108 A * | 12/1998 | Tong et al. | 375/350 |
| 6,236,731 B1 * | 5/2001 | Brennan et al. | 381/316 |
| 6,466,918 B1 | 10/2002 | Spiegel et al. | |
| 6,704,729 B1 | 3/2004 | Klein et al. | |
| 2005/0165587 A1 | 7/2005 | Cheng et al. | |
| 2006/0053018 A1 | 3/2006 | Engdegard et al. | |
| 2007/0121952 A1 | 5/2007 | Engdegard et al. | |

FOREIGN PATENT DOCUMENTS

| | | |
|---|---|---|
| EP | 0 531 242 | 3/1993 |
| JP | 2004533155 | 1/2003 |
| JP | 2005148274 | 6/2005 |

(Continued)

OTHER PUBLICATIONS

International Searching Authority, "International Search Report and Written Opinion" Dec. 22, 2006 18 pages.

(Continued)

*Primary Examiner* — Daniel D Abebe
(74) *Attorney, Agent, or Firm* — Glenn Patent Group

(57) ABSTRACT

A filter apparatus for filtering a time domain input signal to obtain a time domain output signal, which is a representation of the time domain input signal filtered using a filter characteristic having an non-uniform amplitude/frequency characteristic, comprises a complex analysis filter bank for generating a plurality of complex subband signals from the time domain input signals, a plurality of intermediate filters, wherein at least one of the intermediate filters of the plurality of the intermediate filters has a non-uniform amplitude/frequency characteristic, wherein the plurality of intermediate filters have a shorter impulse response compared to an impulse response of a filter having the filter characteristic, and wherein the non-uniform amplitude/frequency characteristics of the plurality of intermediate filters together represent the non-uniform filter characteristic, and a complex synthesis filter bank for synthesizing the output of the intermediate filters to obtain the time domain output signal.

44 Claims, 7 Drawing Sheets

FOREIGN PATENT DOCUMENTS

| | | |
|---|---|---|
| WO | 01/91111 | 11/2001 |
| WO | 03/007656 | 1/2003 |
| WO | WO03015275 | 2/2003 |
| WO | WO2004/099794 A2 | 11/2004 |
| WO | WO-2004097794 | 11/2004 |

OTHER PUBLICATIONS

Russian Decision to Grant, with an English Translation, mailed May 12, 2010 in parallel Russian patent application No. 2008134898, 104 pages.

\* cited by examiner

EFFICIENT FILTERING WITH A COMPLEX MODULATED FILTERBANK

CROSS-REFERENCE TO RELATED APPLICATIONS

This application is a Divisional Application of U.S. patent application Ser. No. 11/469,790 filed Sep. 1, 2006, which claims priority to U.S. patent application Ser. No. 60/744,559 filed Apr. 10, 2006 and to U.S. patent application Ser. No. 60/762,592 filed Jan. 27, 2006 all of which are incorporated herein in their entirety by this reference thereto.

TECHNICAL FIELD

The present invention relates to a filter apparatus and a method for filtering a time domain input signal, a filter generator and a method for generating an intermediate filter definition signal, especially for the field of encoding, decoding, manipulating and filtering of audio signals, e.g. in the field of HRTF (head related transfer function).

BACKGROUND OF THE INVENTION

It has been shown in [P. Ekstrand, "Bandwidth extension of audio signals by spectral band replication", Proc. $1^{st}$ IEEE Benelux Workshop on Model based Processing and Coding of Audio (MPCA-2002), pp. 53-58, Leuven, Belgium, 2002], that a complex-exponential modulated filter bank is an excellent tool for spectral envelope adjustment of audio signals. One application of this feature is audio coding based on Spectral Band Replication (SBR). Other fruitful applications of a complex filter bank include frequency selective panning and spatialization for parametric stereo, see [E. Schuijers, J. Breebart, H. Purnhagen, J. EngdegÅrd: "Low complexity parametric stereo coding", Proc. $116^{th}$ AES convention, 2004, paper 6073] and parametric multichannel coding, see [J. Herre et al.: "The reference model architecture for MPEG spatial audio coding", Proc. $118^{th}$ AES convention, 2005, paper 6447]. In those applications the frequency resolution of the complex filter bank is further enhanced at low frequencies by means of sub-subband filtering. The combined hybrid filter bank hereby achieves a frequency resolution that enables the processing of spatial cues at a spectral resolution which closely follows the spectral resolution of the binaural auditory system.

In some applications, however, the resolution of the filter bank is still insufficient, in the sense that simple gain modifications in each subband do not suffice to truthfully model the action of a given filter. For binaural rendering of multi-channel audio by means of HRTF (head related transfer function) related filtering, the intricate phase characteristics of the filters are important for the perceived audio quality. It is of course possible to apply fast convolution methods based on the DFT (Discrete Fourier Transform) as a post-process to the multi-channel rendering, but if the rendering device already contains the signals in the subband domain of complex exponential modulated filter bank, there are significant advantages in terms of computational complexity and algorithmic integration in performing the HRTF derived filtering in the subband domain, which will be outlined in more detail later. Since HRTF's are different for each individual and the derived filters depend on virtual source and/or listener positions which can for instance be changed by control signals, user interfaces or by other description signals, it is also important to be able to efficiently convert a given HRTF related filter into subband domain filters.

It is therefore the object of the present invention to provide a filter apparatus for filtering a time domain input signal, a method for filtering a time domain input signal, a filter generator or a method for providing an intermediate filter definition signal, which allow a more efficient or a more flexible manipulation of a time domain input signal with a better quality.

This object is achieved by a filter apparatus according to claim 1, by a method for filtering a time domain input signal according to claim 41, a filter generator according to claim 25, a method for providing an intermediate filter definition according to claim 42, a system according to claim 40, a computer program according to claim 43 or a computer program according to claim 44.

SUMMARY OF THE INVENTION

An embodiment of the present invention relates to a filter apparatus for filtering a time domain input signal to obtain a time domain output signal, which is a representation of the time domain input signal filtered using a filter characteristic having a non-uniform amplitude/frequency characteristic comprising a complex analysis filter bank for generating a plurality of complex subband signals from the time domain input signal, a plurality of intermediate filters, wherein one intermediate filter is provided for each complex subband signal, wherein at least one of the intermediate filters of the plurality of intermediate filters has a non-uniform amplitude/frequency characteristic, wherein the plurality of intermediate filters have a shorter impulse response compared to an impulse response of a filter having the filter characteristic, and wherein the non-uniform amplitude/frequency characteristic of the plurality of intermediate filters together represent the non-uniform filter characteristic, and a complex synthesis filter bank for synthesizing the output of the intermediate filters to obtain the time domain output signal.

As a second aspect, a further embodiment of the present invention is a filter generator for providing an intermediate filter definition signal comprising a complex modulated filter bank for filtering an impulse response signal indicative of an amplitude/frequency filter characteristic in a time domain to obtain a plurality of complex valued subband signals as the intermediate filter definition signal, wherein each complex valued subband signal of the complex modulated filter bank corresponds to an impulse response for an intermediate filter for a subband signal, wherein at least one of the complex valued subband signals comprises at least two different non-vanishing values, and wherein each complex valued subband signal is shorter than the impulse response signal.

Embodiments of the first aspect of the present invention are based on the finding that a more efficient and/or a more flexible filtering (or manipulation) of a time domain input signal can be achieved in the subband domain, which is sometimes also referred to as QMF domain (quadrature mirror filter), with a better quality compared to other manipulation schemes. The gain with respect to efficiency, especially computational efficiency, is a consequence of the shorter impulse responses of the intermediate filters compared to the impulse response of a filter having the non-uniform filter characteristic in the time domain and the fact that the subband signals can be processed independently from one another. Due to the shorter impulse responses an embodiment of a filter apparatus can process each complex subband signals output by the complex analysis filter bank individually. Hence, the filtering can be carried out parallely, which speeds up the processing of the time domain input signal dramatically compared to manipulating the time domain input signal directly due to the shorter impulse responses.

Embodiments according the first aspect of the present invention are especially favorable when it comes to balancing computational efficiency on the one hand and quality on the other hand. While a direct processing of the time domain input signal in the time domain can be achieved by a convolution with the impulse response of a filter having the non-uniform amplitude/frequency characteristic, which usually leads to a very good quality, the convolution requires a high computational effort because of the length of the impulse response of the filter in the time domain.

On the other hand, transforming an audio signal into the frequency domain by performing a Fourier transformation represents the tremendous drawback that other manipulations, which are necessary in modern acoustical systems, cannot be efficiently performed in the Fourier domain with a high quality.

Hence, by employing a plurality of intermediate filters, each having a shorter impulse response compared to an impulse response of a filter having the filter characteristic of a corresponding filter in the time domain, of which at least one has an impulse response with at least two non-vanishing values represents a highly favorable compromise between computational efficiency on the one hand and quality on the other hand. As a consequence, embodiments of inventive filter apparatuses represent an excellent compromise between a direct processing of the time domain input signal for instance by means of convoluting the time domain input signal with the longer impulse response indicative of the non-uniform filter characteristic, which leads to an enormous computational effort, and employing a Fourier transform, which leads to more problems in the further course of processing the signals.

The advantages of the embodiments of the first aspect of the present invention unfold especially in the context of FIR-filters (final impulse response), as each of the intermediate filters of the plurality of intermediate filters has a significantly shorter impulse response compared to the impulse response of the FIR-filter in the time domain. Hence, by parallely processing the different subband signals output by the complex analysis filter bank the computational efficiency can drastically be improved. This aspect is especially important in the field of filters having long impulse responses. One field of application, in which filters with very long impulse responses frequently occur, are HRTF-related applications (HRTF=head related transfer function), like for instance down-mixing multiple channel audio signals for feeding to headphones, other head-related speaker systems or stereo sound systems.

In many concrete applications the computational efficiency is even more increased, as the audio signals are already present in the (complex) subband or QMF domain. Hence, in many concrete implementations, the complex analysis filter bank and the complex synthesis filter bank for generating the plurality of complex subband signals from the time domain input signal and for synthesizing the time domain output signal are already present.

With respect to the second aspect, embodiments of the present invention are based on the finding that a more flexible and more efficient filtering of the time domain input signal with a better quality can be achieved by providing an intermediate filter definition signal, which can for instance be provided to a filter apparatus according to the first aspect to define its intermediate filters.

A significant advantage of embodiments according to the second aspect of the present invention is that an intermediate filter definition signal for a set of intermediate filters is obtained by providing an embodiment of the inventive filter generator with a filter defining signal, such as an impulse response signal indicative of an amplitude/frequency filter characteristic of a filter in the time domain or other filter definition signals. Hence, an embodiment of a filter generator provides a filter definition signal for a set of intermediate filters to effectively the same filtering as a filter in the time domain defined by the filter definition signal virtually without introducing aliasing effects. As a consequence, embodiments of an inventive filter generator enable a virtually alias free performance, of an arbitrary filter in the subband domain. By utilizing an embodiment of the inventive filter generator arbitrary filter characteristics can be transferred from the time domain to the subband signal domain, like virtually alias free equalization, low-pass filter characteristics, high-pass filter characteristics, band-pass filter characteristics, band-rejection filter characteristics, resonance filter characteristics, notch filter characteristics or more complex filter characteristics. Among the more complex filter characteristics, a combination of several characteristics as well as HRTF-related filter characteristics are important to mention.

Especially in the context of HRTF-related applications in the field of multi-channel audio systems and other high quality applications it is important to note that embodiments of the inventive filter generator enable to truthfully model an action of a given filter in the time domain in the subband domain. The virtually alias free performance, which is especially important in HRTF-related applications, is made possible as the phase characteristics of a filter in the time domain is (almost) perfectly transferred into the subband domain. Examples illustrating this will be outlined in the further course of the present application.

Among the advantages of embodiments of the second aspect of the present invention is especially the significant gain with respect to the achievable computational efficiency. The complex modulated filter banks of embodiments of the inventive filter generator produce a plurality of complex valued subband signals as the intermediate filter definition signal, wherein each of the complex valued subband signal is shorter than the impulse response signal indicative of the amplitude/frequency filter characteristic in the time domain. The filter generator, hence, produces an intermediate filter definition signal comprising the output of the complex modulated filter bank with its plurality of short complex valued subband signals, which does not only enable a fast, efficient and parallel computation with respect to filtering a time domain input signal to obtain a time domain output signal in the frame work of an embodiment of a filter apparatus, but does also enable a fast, efficient and parallel computation of the intermediate filter definition signal itself. Compared to a direct application of the impulse response signal indicative of the amplitude/frequency filter characteristic in the time domain by convoluting the impulse response signal with the time domain input signal, the application of an embodiment of an inventive filter generator according to the second aspect of the present invention enables a simplified, faster and more efficient computation, which leads to an audibly indistinguishable result compared to the more complex convolution method.

Furthermore, an embodiment of the inventive filter generator also offers the advantage of a significantly enhanced flexibility with respect to the possible filter characteristics applied in the subband domain. As arbitrary filter characteristics can be transferred from the time domain to the subband domain by an embodiment of an inventive filter generator, an enormous flexibility is introduced to audio signal processing and manipulation. For instance, an embodiment of an inventive filter generator is capable of providing an intermediate filter definition signal corresponding to an individually altered filter characteristic of an HRTF-related filter. In the field of HRTF this offers the opportunity to individually modify the HRTF filters according to the needs and hearing capabilities of an individual. Moreover, the source position as well as the listener position with respect to each other and with respect to a (simulated or calculated) environment (e.g. a concert hall, an open space, a stadium) can be adapted. This offers the great advantage of providing a listener with a great flexibility with respect to the acoustic conditions. An embodiment of the inventive filter generator, hence, provides the possibility to virtually switch from a stadium to a concert hall or an open field, without employing the necessity to transfer the audio signals between the time domain, the subband domain and/or the frequency domain. By employing an embodiment of an inventive filter generator all these manipulations of the audio signal can be performed inside the subband domain with a very high quality, which is perceptually indistinguishable from a signal processing in the time domain, but which offers an enormous computational efficiency improvement.

This flexibility is not only limited to switching from one environment to another, e.g. switching from a stadium to a concert hall and visa versa. An embodiment of an inventive filter generator offers the possibility to alter the filter characteristics of the plurality of the intermediate filters in a quasi-continuous fashion. An application in the field of HRTF is an application of an embodiment of the filter generator and/or of the filter apparatus in a head tracking application, in which for instance the position of the listener with respect to different audio sources varies in a quasi-continuous way. Possible applications comprise, for instance, simulations and computer games with a very high quality.

Another advantage of an embodiment of a filter generator is that the application of an embodiment of a filter generator is more efficient with respect to the memory usage, as an impulse response signal provided to the complex modulated filter bank of the filter generator is typically a real valued signal, whereas the intermediate filter definition signal is a complex valued signal of approximately the same over-all length. As a consequence, storing the impulse response signals compared to the intermediate filter definition signals (or the filter taps of the intermediate filters) saves memory, roughly speaking, of an order of 2. Due to the possibility of a fast and efficient parallel computation, especially in the field of memory-sensitive applications comprising a great parameter space with respect to the possible impulse response signals, this represents a significant advantage.

In one embodiment of in an inventive filter generator the filter generator is provided with a filter definition signal, which can comprise for instance the filter taps of a digital filter in the time domain or by a transfer function in the frequency domain, which can comprise the amplitude/frequency characteristic and/or the phase/frequency characteristic of a filter. In these cases, an embodiment of the filter generator furthermore comprises an impulse response signal generator, which provides the appropriate impulse response signal indicative of the resulting amplitude/frequency filter characteristic in the time domain to the complex modulated filter bank of the filter generator. Hence, the inclusion of an impulse response signal generator in some embodiments of an inventive filter generator offers an even more flexibility with respect to providing the intermediate filter definition signal, as not only the impulse response signals in the form of discrete time signals can be provided to an embodiment of the filter generator but also the filter taps or the frequency domain description of a filter in the time domain can be transferred into the subband domain by an appropriate embodiment of a filter generator.

BRIEF DESCRIPTION OF THE DRAWINGS

The present invention will now be described by way of illustrative examples, not limiting the scope or spirit of the invention, with reference to the accompanying drawings, in which.

DESCRIPTION OF PREFERRED EMBODIMENTS

The below-described embodiments are merely illustrative for the principles of the present invention of efficient filtering with a complex modulated filterbank. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the following, objects with the same or similar functional properties are denoted with the same reference signs. Unless explicitly noted otherwise, the description with respect to objects with similar or equal functional properties can be exchanged with respect to each other.

Figure 1A:
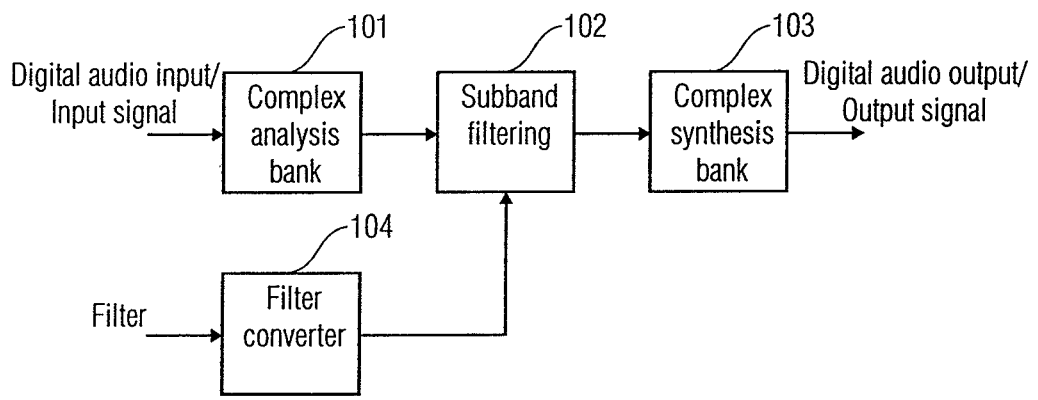
FIG. 1a illustrates the processing of a digital audio signal by means of subband filtering in a system comprising a filter generator and a filter apparatus.

FIG. 1a illustrates in the form of a system comprising embodiments of both a filter apparatus and a filter generator the processing of a digital audio signal by means of subband filtering according to the present invention. This signal path can for instance represent a part of a spatial audio rendering system where the input is a received audio channel and the output is a component of a signal to be played back at the right ear. The input signal (Digital audio signal or time domain input signal) is analyzed by the complex analysis bank 101 by means of filtering with a set of L analysis filters followed by downsampling of a factor L, wherein L is a positive integer, preferably larger than 1. Typically the factor L is a power of 2, preferably L=64. The analysis filters are usually obtained by a complex modulation of a prototype filter p(v), wherein v is a positive integer indicating an index in an array of data or an index of a value in a signal not downsampled by factor L. The output of the filter bank consists of L subband signals that are processed by a subband filtering 102. This subband filtering consists of a combination of manipulations such as subband gain adjustment according to received control data and application of finite impulse response filters applied separately in each subband. The filter taps of the subband filters are obtained from an (inventive) filter converter 104 as an embodiment of a filter generator which takes as input a filter described by direct form filter taps, a frequency domain description or an impulse response (signal). The complex synthesis bank 103 reconstructs an output signal by means of upsampling by a factor L, filtering by L synthesis filters, summation of all the results, and extraction of the real part. The summation of all the results and the extraction of the real part can also be switched with respect to their order, as will be outlined more closely with respect to FIGS. 1c and 1d.

Figure 1B:
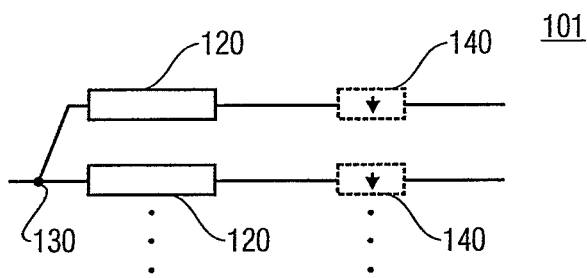
FIG. 1b illustrates a possible solution for a complex analysis bank.

FIG. 1b shows a complex analysis bank 101 in more detail. The complex analysis bank 101 comprises a plurality of L intermediate analysis filters 120 for each subband to be output by complex analysis bank 101. To be more precise, each of the L intermediate analysis filters 120 is connected in parallel to a node 130 to which the time domain input signal to be processed is provided. Each of the intermediate analysis filters 120 is adapted for filtering the input signal of the complex analysis bank 101 with respect to a center frequency of each subband. According to the center frequencies of the different subbands, each subband is labeled by a subband index or index n, wherein n is a non-negative integer, typically in the range from 0 to L−1. The intermediate analysis filters 120 of the complex analysis bank 101 can be derived from a prototype filter p(v) by a complex modulation according to the subband index n of the subband to which the intermediate analysis filter 120 is applied. More details concerning the complex modulation of a prototype filter are explained below.

Either directly by the intermediate analysis filters 120 or by an optional downsampler 140 (denoted by doted line in FIG. 1b) the sampling frequency of the signal output by the intermediate analysis filter bank 120 is reduced by a factor L. As mentioned before, the downsamplers 140 supplied to each subband signal output by the corresponding intermediate analysis filters 120 are optional as, depending on the concrete implementation, the downsampling can also be carried out in the frame work of the intermediate analysis filters 120. In principle, downsampling the signal output by the intermediate analysis filters 120 is not required. Nevertheless, the presence of the explicit or implicit downsamplers 140 is a preferred option as the amount of data provided by the complex analysis bank 101 would alternatively be raised by a factor of L, leading to a significant redundancy of data.

Figure 1C:
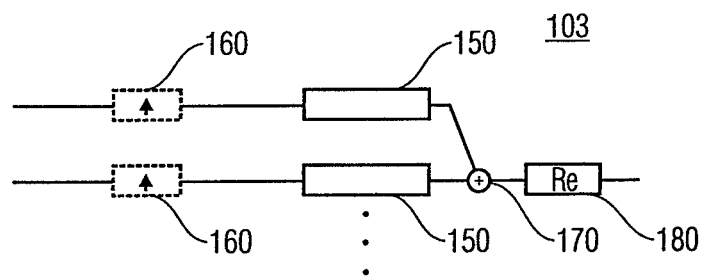
FIG. 1c illustrates a possible solution for a complex synthesis filter bank.

FIG. 1c illustrates a possible solution for a complex synthesis bank 103. The complex synthesis bank 103 comprises L intermediate synthesis filters to which the L subband signals from the subband filtering 102 are provided to. Depending on the concrete implementation of the complex synthesis bank 103 prior to the filtering in the frame work of the intermediate synthesis filters 150, the subband signals are upsampled by L upsampler 160, which reconstruct the sampled frequency of the subband signals by increasing the sampling frequency by a factor of L. In other words, the optional upsampler 160 reconstruct or reform the subband signals provided to the upsampler 160 in such a way that the information contained in each of the subband signals is retained while the sampling frequency is increased by a factor of L. Nevertheless, as already explained in the context of FIG. 1b, the upsamplers 160 are optional components, as the upsampling can also be carried out in the frame work of the intermediate synthesis filters 150. Hence, the step of upsampling the subband signals carried out by the upsampler 160 can be simultaneously processed in the frame work of the intermediate synthesis filers 150. If, however, the downsamplers 190 are neither explicitly nor implicitly implemented, the upsamplers 160 do not have to be implemented explicitly or implicitly.

The intermediate synthesis filters 150 are connected via an output to an adder 170 which sums up the filtered subband signals output by the L intermediate synthesis filters 150. The adder 170 is further connected to a real part extractor 180, which extracts or forms a real valued signal or rather a (real valued) time domain output signal based on the complex valued signal provided by the adder 170. The real part extractor 180 can perform this task for instance by extracting the real part of a complex valued signal provided by the adder 170, by calculating the absolute value of the complex valued signal provided by the adder 170 or by another method that forms a real valued output signal based on a complex valued input signal. In the case of the system shown in FIG. 1a, the signal output by the real part extractor 180 is the time domain output signal output by the embodiment of the inventive filter apparatus.

Figure 1D:
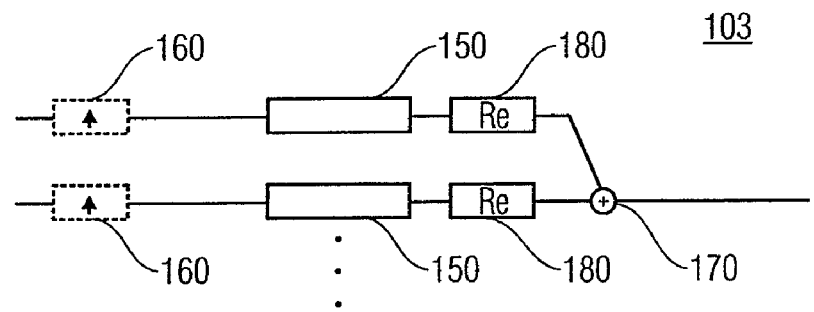
FIG. 1d illustrates a further possible solution for a complex synthesis filter bank.

The second possible solution for a complex synthesis bank 103 shown in FIG. 1d differs from the first possible solution shown in FIG. 1c only concerning the real part extractors 180 and the adder 170. To be more precise, the outputs of the intermediate synthesis filters 150 are connected separately from each subband to a real part extractor 180 extracting or forming a real valued signal based on the complex valued signal output by the intermediate synthesis filters 150. The real part extractor 180 are then connected to the adder 170, which sums up the L real valued signals derived from the L filtered subband signals to form the real valued output signal provided by the adder 170, which in the case of the system shown in FIG. 1a is the time domain output signal.

Figure 1E:
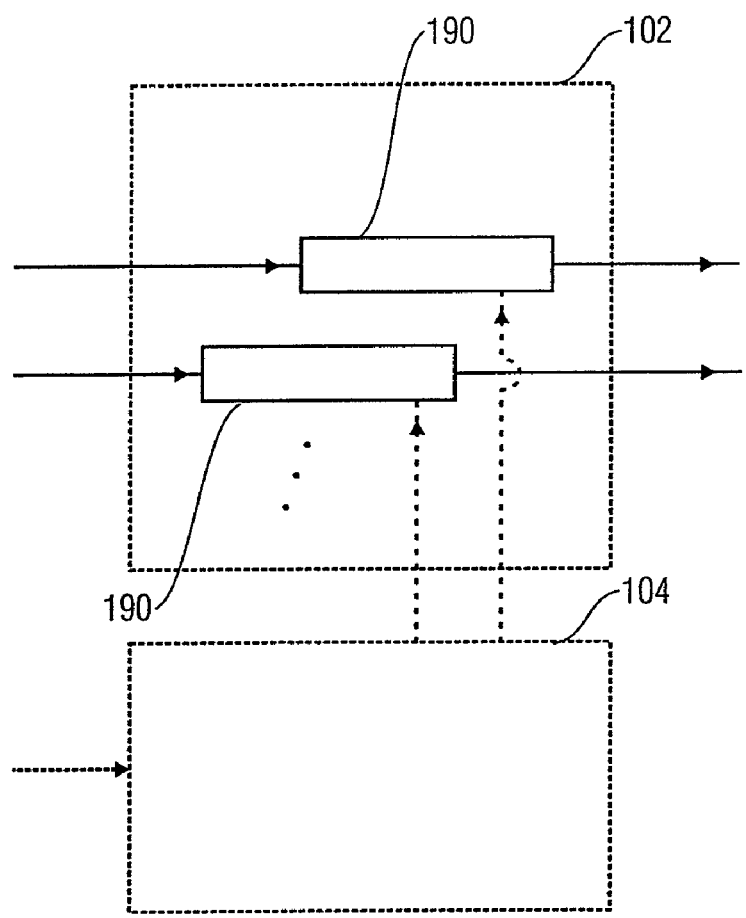
FIG. 1e illustrates an interplay of an embodiment of a filter generator with a plurality of intermediate filters of an embodiment of a filter apparatus.

FIG. 1e shows the subband filtering 102 and its interplay with the filter converter 104 in more details. The subband filtering 102 comprises a plurality of intermediate filters 190, wherein one intermediate filter 190 is provided for each complex valued subband signal provided to the subband filtering 102. Hence, the subband filtering 102 comprises L intermediate filters 190.

The filter converter 104 is connected to each of the intermediate filters 190. As a consequence, the filter converter 104 is capable of providing the filter taps for each of the intermediate filters 190 of the subband filtering 102. More details concerning the filtering done by the intermediate filters 190 will be explained in the further course of the application. Hence, the filters taps provided to the different intermediate filters 190 and output by the filter converter 104 form the intermediate filter definition signal.

Furthermore, it should be noted that the embodiments, solutions and implementations can comprise additional and/or optional delays for delaying any of the signals or a subset of signals, which have been omitted in FIGS. 1a to 1e for the sake of simplicity. Also in the FIGS. 2 to 11 optional delays have been omitted for the sake of simplicity. Nevertheless, delays or delayers can be comprised in elements shown (e.g. filters) or added as optional elements in all embodiments depending on their concrete implementation.

Figure 2:
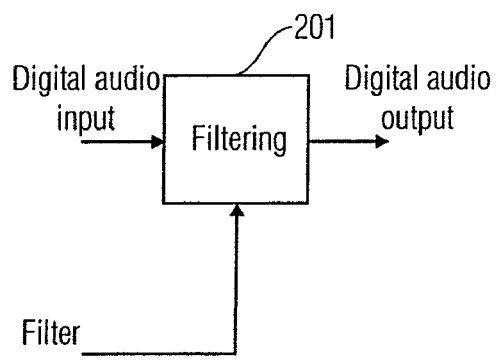
FIG. 2 illustrates the processing of a digital audio signal by means of direct form filtering.

FIG. 2 illustrates the processing of a digital audio signal by means of direct form filtering 201. If the same filter is given as input to the filter converter 104 of FIG. 1 and the direct filtering 201, a design goal for the filter converter 104 is that the digital audio output of 103 should be perceptually (or audibly) indistinguishable from the digital audio output of the direct filtering 201, if the digital audio inputs to the complex analysis bank 101 and the direct filtering 201 are identical and the processing in the direct filtering 102 consists of pure stationary subband filtering.

In the embodiment of the system shown in FIG. 1a to FIG. 1e the filter input to the filter converter 104 is given as a filter definition signal, which can for instance comprise the filter taps of a corresponding time domain filter, a frequency domain description (amplitude/frequency characteristic and/or phase/frequency characteristic) or an impulse response signal of the appropriate filter.

In the case of the direct filtering 201 the same filter definition signal can in principle be used. Depending on the concrete implementation and the filter definition signal, the filtering can be carried out by direct application of the filter taps in the frame work a digital filter, by a discrete Fourier transform along with a transfer function or another frequency domain description or by means of convolution with the impulse response signal.

Figure 3:
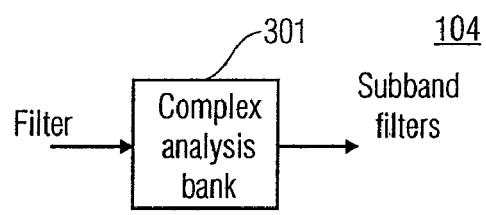
FIG. 3 illustrates a preferred embodiment of a system with a filter converter.

FIG. 3 illustrates a preferred embodiment of a filter converter 104 according to the present invention as an embodiment of a filter generator. The filter is assumed to be given by its impulse response. Viewing this impulse response as a discrete time signal, it is analyzed by an L-band complex analysis (filter) bank 301. The resulting subband signal outputs are then exactly the impulse responses of filters to be applied separately in each subband in the subband filtering 102. In the preferred embodiment shown in FIG. 3, the filter definition signal provided to the filter converter 104 and its complex analysis bank or complex analysis filter bank 301 is the impulse response signal indicative of the amplitude/frequency characteristic of a filter, which is to be transferred into the subband domain. Hence, the output of the complex analysis (filter) bank 301 of each of the L subbands represents the impulse response of the intermediate filters comprised in the subband filtering 102.

The complex analysis bank 301 is in principle derived from the analysis bank 101 but it has a different prototype filter and a slightly different modulation structure, the details of which will be outlined in the following description. The same fast algorithms that are used for an implementation of the complex analysis bank 101 can be reused for complex analysis bank 301, leading to a very fast and very efficient conversion process.

Moreover, the length of the prototype filter $q(v)$ can be designed to be only a fraction of the length of the prototype filter $p(v)$. Due to the downsampling by a factor L, the length of subband filters are also a factor of L smaller than the sum of the lengths of the given time domain filter and the prototype filter $q(v)$. The computational effort is thus reduced in comparison to the direct form filtering 201 by approximately a factor of L/4. The offset factor of 4 is due to the replacement of real filtering with complex filtering. Another offset is the computational cost of the complex analysis and synthesis banks 101 and 103. For efficient implementations this cost is comparable to the cost of rather short FIR filters, and hence negligible, as outlined before. Moreover, this offset of the reduction in computational cost does not exist for systems that already employs these two filter banks 101 and 103.

Figure 4:
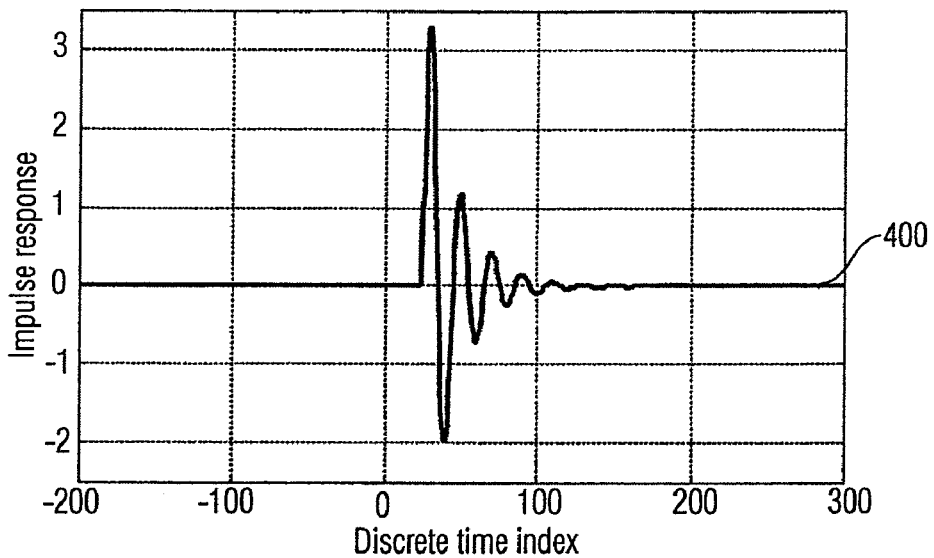
FIG. 4 illustrates a given filter impulse response.

FIG. 4 illustrates an example of a given filter impulse response 400. It consists of 192 (=64·3) nonzero taps. In other words, the impulse response 400 shown in FIG. 4 comprises 192 non-vanishing values.

In the present application, a non-vanishing tap or value is a tap or a value which is ideally not equal to zero. Nevertheless, due to implementation restraints in the frame work of this application a non-vanishing value or tap is a real valued or complex valued tap or value with an absolute value which is larger than a predetermined threshold, e.g. $10^{-s}$ or $2^{-s}$, wherein s is a positive integer depending on the requirements of a concrete implementation. In digital systems this threshold is preferably defined in the binary system (basis 2), wherein the integer s has a predetermined value depending on the specifics of the implementation. Typically, the value s is 4, 5, 6, 7, 8, 10, 12, 14, 16 or 32.

The impulse response 400 of the system of FIG. 1 is indistinguishable from this given impulse response at the resolution of the image, in a case where a L=64 band filterbank with a prototype filter of length 640 (=64·10) is applied and a prototype filter of length 192 (=64·3) is used for the filter converter 104 of FIG. 3. The corresponding intermediate subband filters have only 5 (=3+3−1) taps each, as will be explained later.

Figure 5:
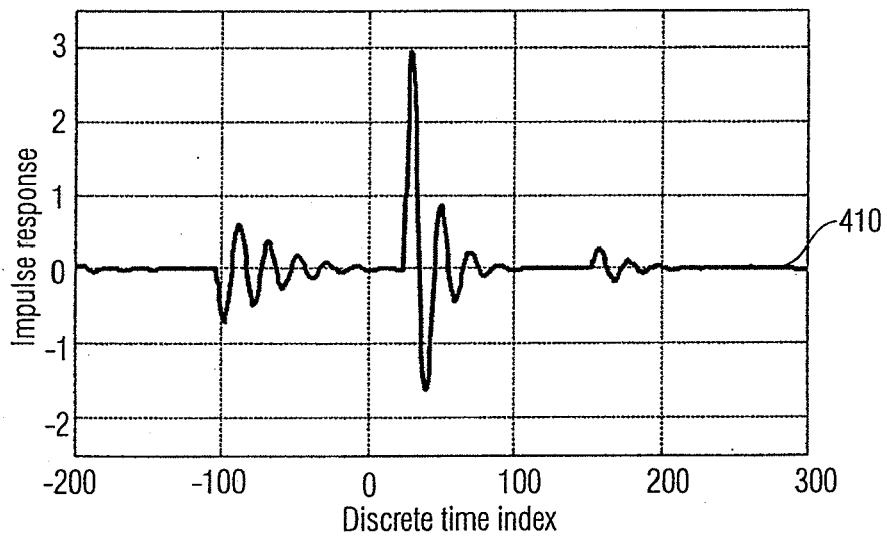
FIG. 5 illustrates an impulse response obtained by complex gain adjustment of subbands.

FIG. 5 illustrates the impulse response 410 of the system of FIG. 1 with a 64 band filterbank, in a special case corresponding to prior art usage for envelope adjustment and equalization. In this case, the subband filters or rather intermediate filters 190 are all of one tap only, so a constant complex gain is applied to each subband. For each subband, the corresponding gain is chosen to be equal to the complex frequency response of the filter of FIG. 4 evaluated at the center frequency of the particular subband. As it can be seen from the result, there are severe pre-echo artifact and there will be a significant perceptual difference between the application of this filter response compared to the target impulse response 400 of FIG. 4.

Figure 6:
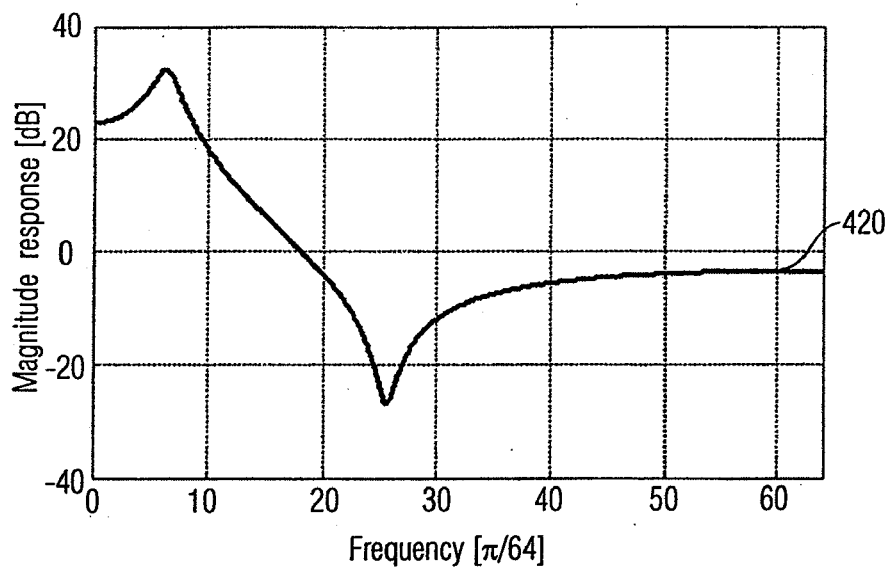
FIG. 6 illustrates the magnitude response of a given filter.

FIG. 6 illustrates the magnitude response 420 of the filter of FIG. 4. The frequency scale of FIG. 6 is adjusted to the resolution of a 64 band filter bank (L=64).

Figure 7:
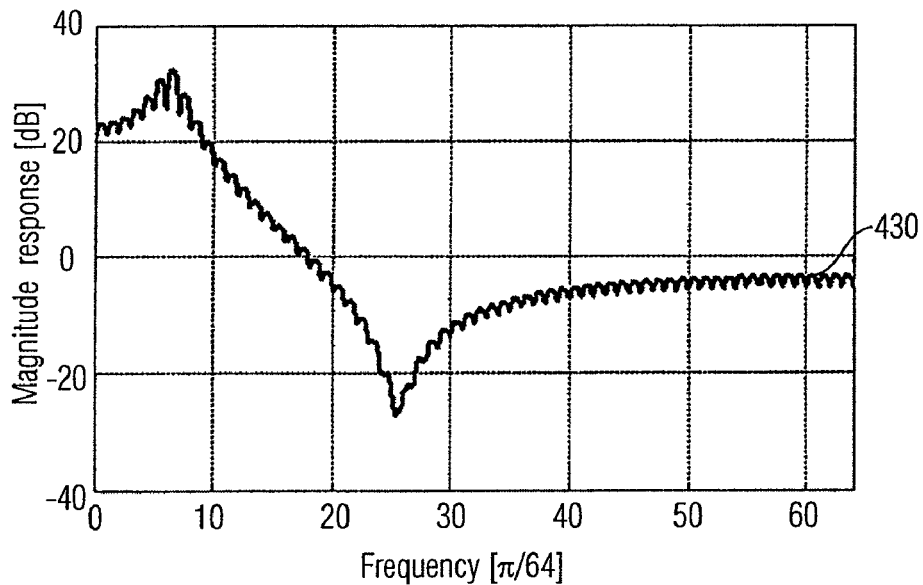
FIG. 7 illustrates the magnitude response of a filter obtained by complex gain adjustment of subbands.

FIG. 7 illustrates the magnitude response 430 of the filter underlying the impulse response 410 shown in FIG. 5. As it can be seen, the usage of only one gain per subband results in a poor approximation to the desired frequency response. The main reason for this is the fast variation of the target phase spectrum. In fact, this prior art method is better suited at modeling linear phase responses.

Figure 8:
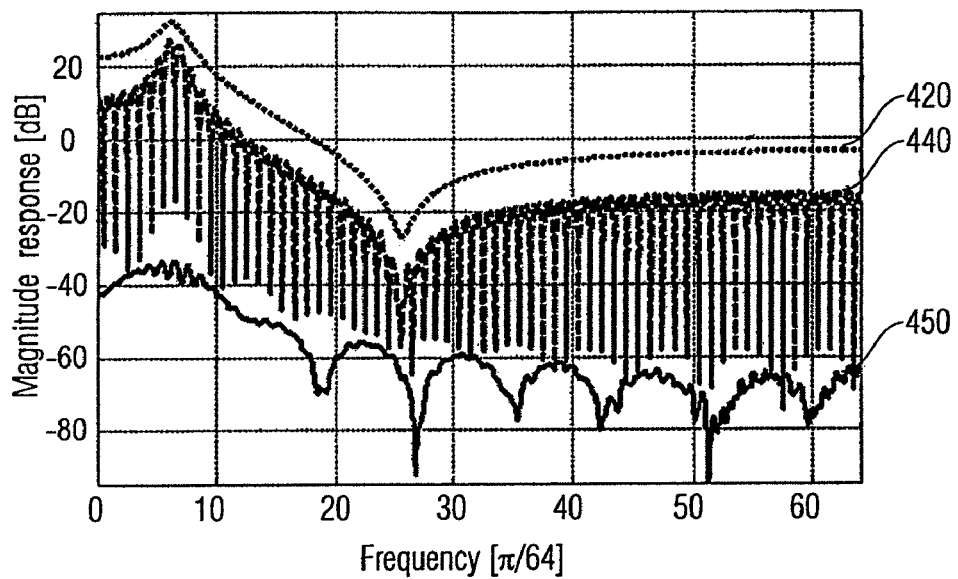
FIG. 8 compares the performance of the present invention with complex gain adjustment of subbands.

FIG. 8 finally compares the performance of an embodiment of the present invention and of the prior art method of complex gain adjustment of subbands. The dotted curve is a redrawing of the target magnitude response 420 of FIG. 6. The dashed curve 440 is the magnitude response of the difference between the complex frequency responses of the target filter and its approximation by the prior art method. The solid curve 450 is the magnitude response of the difference between the complex frequency responses of the target filter and its approximation by the method taught by the present invention with the parameters as discussed during the description of FIG. 4. As it can be seen, the error of the prior art method is small only at the 64 midpoints of filter bank subbands whereas the inventive method leads to an approximation quality in the 50 dB range. It should be pointed out that this is also the level of performance one measures when comparing the output of the inventive system to the output of the reference system for an arbitrary input signal.

As the comparison of the two curves 440 and 450 in FIG. 8 shows, an embodiment of an inventive filter apparatus, an embodiment of a filter generator and a system comprising both embodiments offer a significant advantage concerning the quality of the manipulation of an input signal. The significant difference concerning the quality of filtering (or manipulation) of the input signal outlined above is a consequence of the fact that at least one of the intermediate filters 190 has an impulse response with two or more non-vanishing values. In other words, at least one of the intermediate filters 190 comprises at least two non-vanishing filter taps. Furthermore, it is important to note that the number of subbands L processed by an embodiment of a filter apparatus is larger or at least equal to 2. Nevertheless, the number of subbands L is significantly smaller than the number of frequency bands required for a comparable quality in the case of a Fourier transform-based filtering combined with a filter mainly described by an amplitude/frequency characteristic and/or a phase/frequency characteristic as the transfer function of the filter.

Due to the fact that the impulse response of the intermediate filters 190 are significantly shorter than the impulse response of the underlying filter characteristic in the time domain, the computations with respect to each subband can be carried out significantly faster. Furthermore, as the different subband signals can be processed independently, both an embodiment of the filter apparatus as well as an embodiment of the filter generator 104 can process the respective input signals highly efficiently in a fast and a parallel manner. Hence, the processing of both a digital audio input as an input signal as well as an impulse response indicative of a filter characteristic can be carried out highly efficiently in a parallel fashion. As outlined earlier, an embodiment of an inventive filter apparatus as well as an embodiment of an inventive filter generator combine the advantages of both a direct processing of audio signals in the time domain leading to a very high quality and using a combination of a Fourier transform along with a transfer function in the frequency domain offering a high efficiency as each frequency band is only multiplied with a (complex or real valued) tap in the process of filtering the signal.

On the other hand, the disadvantages of both, purely processing the input signals in the time domain, which leads to an enormous computation effort, and those of a Fourier transform, can be significantly reduced and suppressed to a level that the output of an embodiment of a filter apparatus is perceptually indistinguishable from the quality of a direct processing in the time domain.

These two advantages offer a great flexibility for filtering digital signals with varying filtering characteristics. This is especially important in the field of HRTF, as HRTF-related filters usually have a very long impulse response. Hence, an embodiment of an inventive filter apparatus comprising a complex analysis filter bank 101, a plurality of intermediate filters 190 in the subband filtering 102 and a complex synthesis filter bank 103 offers especially in the field of HRTF-related applications significant computational advantages due to the possible parallel processing of subband signals.

Embodiments of a filter generator and embodiments of systems comprising both a filter apparatus and a filter generator offer furthermore the advantage that filters can easily be adapted to specific environments, parameters or other specific needs of the application at hand. Especially in terms of HRTF-related applications, an embodiment of such a system can be used in head-tracking applications, in which several sources of sounds and noises as well as the position of the listener vary over time. Such an embodiment of a system comprising a filter apparatus and a filter generator therefore offer a highly efficient and flexible way to present an audio impression of a three dimensional arrangement of sound sources with respect to a varying position and orientation of a hypothetical listener via headphones or other head-related sound systems (stereo sound systems).

As this last example illustrates, an embodiment of an inventive filter apparatus along with an inventive filter generator offers not only a highly efficient system for audio manipulation with an excellent quality but also a very flexible way to introduce altering audio impressions in an efficient way.

Complex Modulated Filter Banks

In the following, let $$Z(\omega) = \sum_{v=-\infty}^{\infty} z(v)\exp(-iv\omega)$$

be the discrete time Fourier transform of a discrete time signal z(v). As before, v is an integer indicating an index or a time index of a time signal, while $\omega=2\pi \cdot f$ is the circular frequency associated to the frequency f, $\pi$ is the circular number ($\pi=3.1415926\ldots$) and $i=j=\sqrt{-1}$ is the imaginary unit.

The complex exponential modulated L-band filterbank is defined from a real valued prototype filter p(v) of finite length. For the computations below it will be assumed by extension with zeros that the prototype filter is defined for all integers v. Given a real valued discrete time signal x(v) the analysis filter bank 101 applies, as already explained, the complex modulated prototype filters followed by downsampling by a factor L in order to output the subband signals, $$c_n(k) = \sum_{v=-\infty}^{\infty} x(v+kL)p(v)\exp\left(-i\frac{\pi}{L}\left(n+\frac{1}{2}\right)(v+\theta)\right), \quad (1)$$

for each subband index n=0, 1, ..., L−1, and integer time index k. The time index k differs from the time index v with respect to the fact that k refers to the downsampled signals, whereas the integer v withers to signals with the full sample frequency.

Given complex valued subband signals $d_n(k)$, the synthesis filter bank 103 applies filtering followed by upsampling by a factor of L and a real value extraction in order to output the real valued signals, as already explained, to obtain the output signal $$y(v) = \mathrm{Re}\left\{2L\sum_{k=-\infty}^{\infty}\sum_{n=0}^{L-1} d_n(k)p(v-kL)\exp\left(i\frac{\pi}{L}\left(n+\frac{1}{2}\right)(v-kL+\psi)\right)\right\}. \quad (2)$$

In the equations (1) and (2) θ and ψ represent (constant) phase factors for filtering the real valued discrete time signal x(v) into complex valued subband signal and for reconstructing real valued output samples y(v) from complex valued subband signals $d_n(k)$. It is well known that a prototype filter and fixed phase factors θ and ψ can be chosen to give perfect reconstruction, y(v)=x(v), in the case where $d_n(k)=c_n(k)$, that is when the subband signals are unaltered. In practice, the perfect reconstruction property will hold true up to a delay (and/or a sign change), but in the computations that follow, this detail will be ignored by allowing the use of an acausal prototype filter. The present invention is applicable to the pseudo QMF type of design as taught by PCT/SE02/00626 "Aliasing reduction using complex exponential modulated filter banks". Here the prototype filter is symmetric p(−v)=p(v), and its discrete time Fourier transform P(ω) essentially vanishes outside the interval |ω|≦π/L. The perfect reconstruction is also replaced by a near-perfect reconstruction property. For the derivation that follows it will be assumed for simplicity that both perfect reconstruction holds and that P(ω)=0 for π/L<|ω|≦π. Moreover, the phase factors are assumed to satisfy the condition that ψ−θ is equal to an integer multiple of 4L.

In a critically sampled filter bank, the alteration of subband signals prior to synthesis usually leads to the introduction of aliasing artifacts. This is overcome here due to the fact that an oversampling by a factor two is introduced by using complex valued signals. Although the total sampling rate of the subband samples is identical to the sampling rate of the discrete time input signal, the input signal is real valued and the subband samples are complex valued. As it will be outlined below, the absence of alias opens the door for efficient time invariant signal processing.

Subband Filtering in a Complex Modulated Filter Bank

Consider the modification of subband filtering 102 of each subband signal obtained by filtering the analysis samples $c_n(k)$ from the complex analysis bank 101 with a filter with impulse response $g_n(k)$ prior to the synthesis (2) performed by the complex synthesis (filter) bank 103

$$d_n(k) = \sum_l g_n(l)c_n(k-l). \quad (3)$$

Elementary computations show that given the assumptions on the frequency response of the prototype filter, the resulting effect on the reconstructed time signal is that of a discrete time filtering $$Y(\omega)=G(\omega)X(\omega), \quad (4)$$

where $$G(\omega) = \sum_{n=-L}^{L-1} G_n(L\omega)\left|P\left(\omega - \frac{\pi}{L}\left(n+\frac{1}{2}\right)\right)\right|^2. \quad (5)$$

Here, $$G_n(\omega) = \Sigma_n g_n(k)\exp(-ik\omega)$$

is the discrete time Fourier transform of the filter applied in subband n for n≦0 and $$G_n(\omega)=G_{-1-n}(-\omega)^* \text{ for } n<0. \quad (6)$$

where * denotes complex conjugation. Observe here that the special case $G_n(\omega)=1$ leads to $G(\omega)=1$ in (5) due to the assumed special design of the prototype p(v), which implies $$\sum_{n=-L}^{L-1}\left|P\left(\omega - \frac{\pi}{L}\left(n+\frac{1}{2}\right)\right)\right|^2 = 1 \quad (7)$$

Another case of interest is $G_n(\omega)=\exp(-i\omega)$ which leads to $G(\omega)=\exp(-iL\omega)$, so that y(v)=x(v−L).

Approximating a Given Filter Response by Subband Filtering

Let H(ω) be a given filter (e.g. transfer function) with real valued impulse response h(v). This data is considered as input to the filter converter 104. In view of (5) and (7), a trivial choice for the subband filters which result in the desired response G(ω)=H(ω) is given by $$G_n(\omega)=H(\omega/L), \text{ for } |\omega-\pi(n+½)|\leq\pi, \quad (8)$$

The drawback of this formula is that although H(ω) is a smooth function of ω, the periodized segment of it defined by (8) will exhibit jumps and the impulse response of the subband filters will be unnecessarily long. The prior art usage of the complex pseudo QMF bank for equalization or envelope adjustment consists of applying a single gain $g_n$ in each subband, which results in the transfer function $$G(\omega) = \sum_{n=-L}^{L-1} g_n\left|P\left(\omega - \frac{\pi}{L}\left(n+\frac{1}{2}\right)\right)\right|^2 \quad (9)$$

with the extension $g_n=-g_{-1-n}^*$ for n<0 defined in accordance with (6). In view of (7), one achieves $$G\left(\frac{\pi}{L}\left(n+\frac{1}{2}\right)\right) = g_n, \text{ for } n = 0, 1, \ldots, L-1, \quad (10)$$

and the transfer function is interpolated between those frequencies. For target filter responses H(ω) that vary slowly as a function of the frequency ω, a first method of approximating the filter is therefore obtained by choosing $$G_n(\omega) = H\left(\frac{\pi}{L}\left(n+\frac{1}{2}\right)\right). \quad (11)$$

An example of the resulting quality of this procedure is given in FIGS. 5 and 7.

According to an embodiment of the present invention a filter generator or a filter converter 104 is used to teach to convert the filter (defined by its impulse response) h(v) into intermediate subband filters 190 by means of the second analysis filter bank 301 which employs real valued prototype filter q(v), $$g_n(k) = \sum_{v=-\infty}^{\infty} h(v+kL)q(v)\exp\left(-i\frac{\pi}{L}\left(n+\frac{1}{2}\right)v\right). \quad (12)$$

In terms of Fourier transforms this reads $$G_n(\omega) = \frac{1}{L}\sum_{l=0}^{L-1} H\left(\frac{\omega+2\pi l}{L}\right)Q\left(\frac{\omega+2\pi l}{L} - \frac{\pi}{L}\left(n+\frac{1}{2}\right)\right)^*. \quad (13)$$

The advantage of this procedure is that any given filter h(v) can be efficiently transformed into intermediate subband filter responses. If q(v) has $K_Q \cdot L$ taps, a time domain filter h(v) of $K_H \cdot L$ taps is converted into subband domain filters (12) with $K_H+K_Q-1$ taps, wherein $K_H$ and $K_Q$, are positive integers. With respect to the exemplary numbers given in the context of the description of FIG. 4, $K_H$ and $K_Q$ are equal to 3 and with a prototype filter length and an impulse response corresponding to a length of 3·64=192 (L=64) each. Hence, each intermediate subband filter 190 has an impulse response length of only 3+3−1=5 taps each.

Design of the Prototype Filter for the Filter Converter

Insertion of (13) into (5) yields $$G(\omega) = \sum_{l=0}^{L-1} H\left(\frac{\omega + 2\pi}{\frac{2\pi}{L}l}\right) \sum_{n=-L}^{L-1} \frac{1}{L} Q\left(\omega + \frac{2\pi}{L}l - \frac{\pi}{L}\left(n+\frac{1}{2}\right)\right)^* \left|P\left(\omega - \frac{\pi}{L}\left(n+\frac{1}{2}\right)\right)\right|^2. \quad (14)$$

Hence, the condition for $G(\omega)=H(\omega)$ to hold is that $$\sum_{n=-L}^{L-1} \frac{1}{L} Q\left(\omega + \frac{2\pi}{L}l - \frac{\pi}{L}\left(n+\frac{1}{2}\right)\right)^* \left|P\left(\omega - \frac{\pi}{L}\left(n+\frac{1}{2}\right)\right)\right|^2 = \delta[l], \quad (15)$$

where $\delta[l]=1$ for $l=0$ and $\delta[l]=0$ for $l\neq 0$. A simple solution to (15) is given by the brick wall filter $$Q(\omega) = \begin{cases} L, & \text{for } |\omega| \leq \pi/L; \\ 0, & \text{for } \pi/L < |\omega| \leq \pi. \end{cases}$$

This prototype filter corresponds to the choice (8) and has the disadvantage of having an infinite and slowly decaying impulse response $q(\nu)$. Instead, the present invention teaches to solve (15) approximately (e.g. in the least-square sense) with a finite impulse response filter $q(\nu)$. The time domain equivalent of (15) is the system of linear equations for $n=0, 1 \ldots, L-1$ and for all integers $k$, $$\sum_{\nu=-\infty}^{\infty} p_2(n + \nu L - 2kL)q(n + \nu L) = \frac{1}{2L}\delta[k], \quad (16)$$

where $$p_2(\nu) = \sum_{l=-\infty}^{\infty} p(l)p(l+\nu) \quad (17)$$

is the autocorrelation of $p(\nu)$. For any given support length the system of linear equations (16) can be solved in the least squares sense for a prototype filter $q(\nu)$. It is desirable to use a support significantly shorter than that of the original filter bank prototype filter $p(\nu)$, and in that case the linear system (16) is over-determined. A given quality of approximation can also be traded for other desirable properties via joint optimization. One example of such a property is a low pass type of frequency response $Q(\omega)$.

In the following the determination of a multi-slot QMF representation (subband domain) of the HRTF filters is described. The filter conversion from the time domain into the complex QMF subband domain is performed by an FIR filter in the filter converter 104 of FIG. 1a. To be more precise, the following description outlines a method for implementing a given FIR filter $h(\nu)$ of length $N_h$ in the complex QMF subband domain. The principle of the operation is illustrated in FIG. 1a in the case of a system also comprising an embodiment of an inventive filter apparatus.

The subband filtering itself is carried out by a set of or a plurality of intermediate filters 190 inside the subband filtering 102. To be more precise, the subband filtering consist of the separate application of one complex valued FIR intermediate filter $g_n(l)$ for each QMF subband with an index $n=0, 1, \ldots, 63$. In other words, in the following description special references will be made to embodiments with L=64 different subband signals. Nevertheless, this specific number of subband signals is not essential and the appropriate equations will also be given in a more general form.

One of the key components of the system shown in FIG. 1a is the filter converter 104, which converts the given time domain FIR filter $h(\nu)$ into the complex subband domain filters $g_n(l)$. The filter converter 104 comprises a complex analysis bank 301 similar to the QMF analysis bank 101. The prototype filter of the complex analysis filter bank 301 of the filter converter 104 $q(\nu)$ of length 192 (=3·64) for the specific case of L=64 subband signals are created by solving in the least square sense the over determined system of the equation (16). The filter coefficients $q(\nu)$ or rather the relations they fulfill will be described in more detail for the case of L=64 subbands signals later on.

To be more accurate in terms of mathematical description, an extension with zeros in the time domain FIR filter is defined by $$\tilde{h}(\nu) = \begin{cases} h(\nu), & \nu = 0, 1, \ldots, N_h - 1, \\ 0, & \text{otherwise} \end{cases} \quad (18)$$

The resulting intermediate subband domain filters are based on equation (12) and can be expressed in the general case as $$g_n(l) = \sum_{\nu=0}^{N_q-1} \tilde{h}(\nu + L \cdot (l - l_0)) \cdot q(\nu) \cdot \exp\left(-i\frac{\pi}{L}\left(n + \frac{1}{2}\right)(\nu - \nu_0)\right) \quad (19)$$

wherein $l_0$ and $\nu_0$ are delays, $l$ is an integer indicating an index of the filter taps and $N_q$ (=$N_Q$) is the length of the impulse response of the prototype filter $q(\nu)$.

It should be noted, that in the frame work of the present application under an equation being based on an equation an introduction of additional delays (cf. $l_0$ and $\nu_0$) factors, additional coefficients and an introduction of a window function or another simple function is understood.

In the case L=64, the expression for the subband domain filters or intermediate filters 190 becomes $$g_n(l) = \sum_{\nu=0}^{191} \tilde{h}(\nu + 64 \cdot (l-2)) \cdot q(\nu) \cdot \exp\left(-i\frac{\pi}{64}\left(n+\frac{1}{2}\right)(\nu - 95)\right) \quad (20)$$

These subdomain filters have a length $L_q = K_h + 2$, where $$K_h = \lceil N_h/64 \rceil \quad (21)$$

and $N_h$ is the length of the impulse response $h(\nu)$ of the filter characteristics to be transferred into the subband domain.

In this case, the integer n=0, 1, ..., 63 is once again the index of a subband and l=0, 1, ..., (K$_n$+1) is an integer indicating taps of the resulting intermediate filters 190.

The extra addend of (−2) in equation (20) as compared to equation (12) is there, because equation (12) was developed without any regard to casualty of filters. Real implementations will cause always introduce delays. Hence, depending on the concrete implementation, additional delayers or delays can be implemented in the embodiments shown in FIGS. 1*a* to 1*e* and FIGS. 2 to 11, which have been omitted for the sake of simplicity in Figures mentioned.

As outlined earlier, in many cases the system of linear equations (16) is over determined. Nevertheless, it can be solved or approximated in the least square sense with respect to the prototype filter coefficients q(v). Solving the system of linear equations (16) in the least square sense, leads to the filter taps of the prototype filter q(v) to fulfill the following relations for integers v from 0 to 191:

$-0.204 \leq q[0] \leq -0.202$ $-0.199 \leq q[1] \leq -0.197$ $-0.194 \leq q[2] \leq -0.192$ $-0.189 \leq q[3] \leq -0.187$ $-0.183 \leq q[4] \leq -0.181$ $-0.178 \leq q[5] \leq -0.176$ $-0.172 \leq q[6] \leq -0.170$ $-0.166 \leq q[7] \leq -0.164$ $-0.160 \leq q[8] \leq -0.158$ $-0.154 \leq q[9] \leq -0.152$ $-0.148 \leq q[10] \leq -0.146$ $-0.142 \leq q[11] \leq -0.140$ $-0.135 \leq q[12] \leq -0.133$ $-0.129 \leq q[13] \leq -0.127$ $-0.122 \leq q[14] \leq -0.120$ $-0.116 \leq q[15] \leq -0.114$ $-0.109 \leq q[16] \leq -0.107$ $-0.102 \leq q[17] \leq -0.100$ $-0.096 \leq q[18] \leq -0.100$ $-0.089 \leq q[19] \leq -0.094$ $-0.082 \leq q[20] \leq -0.087$ $-0.075 \leq q[21] \leq -0.080$ $-0.068 \leq q[22] \leq -0.066$ $-0.061 \leq q[23] \leq -0.059$ $-0.054 \leq q[24] \leq -0.052$ $-0.046 \leq q[25] \leq -0.044$ $-0.039 \leq q[26] \leq -0.037$ $-0.032 \leq q[27] \leq -0.030$ $-0.024 \leq q[28] \leq -0.022$ $-0.017 \leq q[29] \leq -0.015$ $-0.009 \leq q[30] \leq -0.007$ $-0.002 \leq q[31] \leq 0.000$ $0.006 \leq q[32] \leq 0.008$ $0.014 \leq q[33] \leq 0.016$ $0.021 \leq q[34] \leq 0.023$ $0.029 \leq q[35] \leq 0.031$ $0.037 \leq q[36] \leq 0.039$ $0.045 \leq q[37] \leq 0.047$ $0.054 \leq q[38] \leq 0.056$ $0.062 \leq q[39] \leq 0.064$ $0.070 \leq q[40] \leq 0.072$ $0.079 \leq q[41] \leq 0.081$ $0.087 \leq q[42] \leq 0.089$ $0.096 \leq q[43] \leq 0.098$ $0.105 \leq q[44] \leq 0.107$ $0.113 \leq q[45] \leq 0.115$ $0.122 \leq q[46] \leq 0.124$ $0.132 \leq q[47] \leq 0.134$ $0.141 \leq q[48] \leq 0.143$ $0.150 \leq q[49] \leq 0.152$ $0.160 \leq q[50] \leq 0.162$ $0.170 \leq q[51] \leq 0.172$ $0.180 \leq q[52] \leq 0.182$ $0.190 \leq q[53] \leq 0.192$ $0.200 \leq q[54] \leq 0.202$ $0.210 \leq q[55] \leq 0.212$ $0.221 \leq q[56] \leq 0.223$ $0.232 \leq q[57] \leq 0.234$ $0.243 \leq q[58] \leq 0.245$ $0.254 \leq q[59] \leq 0.256$ $0.266 \leq q[60] \leq 0.268$ $0.278 \leq q[61] \leq 0.280$ $0.290 \leq q[62] \leq 0.292$ $0.303 \leq q[63] \leq 0.305$ $0.902 \leq q[64] \leq 0.904$ $0.909 \leq q[65] \leq 0.911$ $0.917 \leq q[66] \leq 0.919$ $0.924 \leq q[67] \leq 0.926$ $0.930 \leq q[68] \leq 0.932$ $0.936 \leq q[69] \leq 0.938$ $0.942 \leq q[70] \leq 0.944$ $0.947 \leq q[71] \leq 0.949$ $0.952 \leq q[72] \leq 0.954$ $0.957 \leq q[73] \leq 0.959$ $0.961 \leq q[74] \leq 0.963$ $0.965 \leq q[75] \leq 0.967$ $0.969 \leq q[76] \leq 0.971$ $0.972 \leq q[77] \leq 0.974$ $0.975 \leq q[78] \leq 0.977$ $0.978 \leq q[79] \leq 0.980$ $0.981 \leq q[80] \leq 0.983$ $0.984 \leq q[81] \leq 0.986$ $0.986 \leq q[82] \leq 0.988$ $0.988 \leq q[83] \leq 0.990$ $0.990 \leq q[84] \leq 0.992$ $0.992 \leq q[85] \leq 0.994$ $0.993 \leq q[86] \leq 0.995$ $0.995 \leq q[87] \leq 0.997$ $0.996 \leq q[88] \leq 0.998$ $0.997 \leq q[891] \leq 0.999$ $0.998 \leq q[90] \leq 1.000$ $0.999 \leq q[91] \leq 1.001$ $0.999 \leq q[92] \leq 1.001$ $1.000 \leq q[93] \leq 1.002$ $1.000 \leq q[94] \leq 1.002$ $1.000 \leq q[95] \leq 1.002$ $1.000 \leq q[96] \leq 1.002$ $1.000 \leq q[97] \leq 1.002$ $0.999 \leq q[98] \leq 1.001$ $0.999 \leq q[99] \leq 1.001$ $0.998 \leq q[100] \leq 1.000$ $0.997 \leq q[101] \leq 0.999$ $0.996 \leq q[102] \leq 0.998$ $0.995 \leq q[103] \leq 0.997$ $0.993 \leq q[104] \leq 0.995$ $0.992 \leq q[105] \leq 0.994$ $0.990 \leq q[106] \leq 0.992$ $0.988 \leq q[107] \leq 0.990$ $0.986 \leq q[108] \leq 0.988$ $0.984 \leq q[109] \leq 0.986$ $0.981 \leq q[110] \leq 0.983$ $0.978 \leq q[111] \leq 0.980$ $0.975 \leq q[112] \leq 0.977$ $0.972 \leq q[113] \leq 0.974$ $0.969 \leq q[114] \leq 0.971$ $0.965 \leq q[115] \leq 0.967$ $0.961 \leq q[116] \leq 0.963$ $0.957 \leq q[117] \leq 0.959$ $0.952 \leq q[118] \leq 0.954$ $0.947 \leq q[119] \leq 0.949$ $0.942 \leq q[120] \leq 0.944$ $0.936 \leq q[121] \leq 0.938$ $0.930 \leq q[122] \leq 0.932$ $0.924 \leq q[123] \leq 0.926$ $0.917 \leq q[124] \leq 0.919$ $0.909 \leq q[125] \leq 0.911$ $0.902 \leq q[126] \leq 0.904$ $0.893 \leq q[127] \leq 0.895$ $0.290 \leq q[128] \leq 0.292$ $0.278 \leq q[129] \leq 0.280$ $0.266 \leq q[130] \leq 0.268$ $0.254 \leq q[131] \leq 0.256$ $0.243 \leq q[132] \leq 0.245$ $0.232 \leq q[133] \leq 0.234$ $0.221 \leq q[134] \leq 0.223$ $0.210 \leq q[135] \leq 0.212$ $0.200 \leq q[136] \leq 0.202$ $0.190 \leq q[137] \leq 0.192$ $0.180 \leq q[138] \leq 0.182$ $0.170 \leq q[139] \leq 0.172$ $0.160 \leq q[140] \leq 0.162$ $0.150 \leq q[141] \leq 0.152$ $0.141 \leq q[142] \leq 0.143$ $0.132 \leq q[143] \leq 0.134$ $0.122 \leq q[144] \leq 0.124$ $0.113 \leq q[145] \leq 0.115$ $0.105 \leq q[146] \leq 0.107$ $0.096 \leq q[147] \leq 0.098$ $0.087 \leq q[148] \leq 0.089$ $0.079 \leq q[149] \leq 0.081$ $0.070 \leq q[150] \leq 0.072$ $0.062 \leq q[151] \leq 0.064$ $0.054 \leq q[152] \leq 0.056$ $0.045 \leq q[153] \leq 0.047$ $0.037 \leq q[154] \leq 0.039$ $0.029 \leq q[155] \leq 0.031$ $0.021 \leq q[156] \leq 0.023$ $0.014 \leq q[157] \leq 0.016$ $0.006 \leq q[158] \leq 0.008$ $-0.002 \leq q[159] \leq 0.000$ $-0.009 \leq q[160] \leq -0.007$ $-0.017 \leq q[161] \leq -0.015$ $-0.024 \leq q[162] \leq -0.022$ $-0.032 \leq q[163] \leq -0.030$ $-0.039 \leq q[164] \leq -0.037$ $-0.046 \leq q[165] \leq -0.044$ $-0.054 \leq q[166] \leq -0.052$ $-0.061 \leq q[167] \leq -0.059$ $-0.068 \leq q[168] \leq -0.066$ $-0.075 \leq q[169] \leq -0.073$ $-0.082 \leq q[170] \leq -0.080$ $-0.089 \leq q[171] \leq -0.087$ $-0.096 \leq q[172] \leq -0.094$ $-0.102 \leq q[173] \leq -0.100$ $-0.109 \leq q[174] \leq -0.107$ $-0.116 \leq q[175] \leq -0.114$ $-0.122 \leq q[176] \leq -0.120$ $-0.129 \leq q[177] \leq -0.127$ $-0.135 \leq q[178] \leq -0.133$ $-0.142 \leq q[179] \leq -0.140$ $-0.148 \leq q[180] \leq -0.146$ $-0.154 \leq q[181] \leq -0.152$ $-0.160 \leq q[182] \leq -0.158$ $-0.166 \leq q[183] \leq -0.164$ $-0.172 \leq q[184] \leq -0.170$ $-0.178 \leq q[185] \leq -0.176$ $-0.183 \leq q[186] \leq -0.181$ $-0.189 \leq q[187] \leq -0.187$ $-0.194 \leq q[188] \leq -0.192$ $-0.199 \leq q[189] \leq -0.197$ $-0.204 \leq q[190] \leq -0.202$ $-0.209 \leq q[191] \leq -0.207$ To be more precise, the filter coefficients q(ν) obey the following relations:

$-0.20294 \leq q[0] \leq -0.20292$ $-0.19804 \leq q[1] \leq -0.19802$ $-0.19295 \leq q[2] \leq -0.19293$ $-0.18768 \leq q[3] \leq -0.18766$ $-0.18226 \leq q[4] \leq -0.18224$ $-0.17668 \leq q[5] \leq -0.17666$ $-0.17097 \leq q[6] \leq -0.17095$ $-0.16514 \leq q[7] \leq -0.16512$ $-0.15919 \leq q[8] \leq -0.15917$ $-0.15313 \leq q[9] \leq -0.15311$ $-0.14697 \leq q[10] \leq -0.14695$ $-0.14071 \leq q[11] \leq -0.14069$ $-0.13437 \leq q[12] \leq -0.13435$ $-0.12794 \leq q[13] \leq -0.12792$ $-0.12144 \leq q[14] \leq -0.12142$ $-0.11486 \leq q[15] \leq -0.11484$ $-0.10821 \leq q[16] \leq -0.10819$ $-0.10149 \leq q[17] \leq -0.10147$ $-0.09471 \leq q[18] \leq -0.09469$ −0.08786≦q[19]≦−0.08784

−0.08095≦q[20]≦−0.08093

−0.07397≦q[21]≦−0.07395

−0.06694≦q[22]≦−0.06692

−0.05984≦q[23]≦0.05982

−0.05269≦q[24]≦−0.05267

−0.04547≦q[25]≦−0.04545

−0.03819≦q[26]≦−0.03817

−0.03085≦q[27]≦−0.03083

−0.02345≦q[28]≦−0.02343

−0.01598≦q[29]≦−0.01596

−0.00845≦q[30]≦−0.00843

−0.00084≦q[31]≦−0.00082

0.00683≦q[32]≦0.00685

0.01458≦q[33]≦0.01460

0.02240≦q[34]≦0.02242

0.03030≦q[35]≦0.03032

0.03828≦q[36]≦0.03830

0.04635≦q[37]≦0.04637

0.05451≦q[38]≦0.05453

0.06275≦q[39]≦0.06277

0.07110≦q[40]≦0.07112

0.07954≦q[41]≦0.07956

0.08809≦q[42]≦0.08811

0.09675≦q[43]≦0.09677

0.10552≦q[44]≦0.10554

0.11442≦q[45]≦0.11444

0.12344≦q[46]≦0.12346

0.13259≦q[47]≦0.13261

0.14189≦q[48]≦0.14191

0.15132≦q[49]≦0.15134

0.16091≦q[50]≦0.16093

0.17066≦q[51]≦0.17068

0.18058≦q[52]≦0.18060

0.19067≦q[53]≦0.19069

0.20095≦q[54]≦0.20097

0.21143≦q[55]≦0.21145

0.22211≦q[56]≦0.22213

0.23300≦q[57]≦0.23302

0.24412≦q[58]≦0.24414

0.25549≦q[59]≦0.25551

0.26711≦q[60]≦0.26713

0.27899≦q[61]≦0.27901

0.29117≦q[62]≦0.29119

0.30364≦q[63]≦0.30366

0.90252≦q[64]≦0.90254

0.91035≦q[65]≦0.91037

0.91769≦q[66]≦0.91771

0.92457≦q[67]≦0.92459

0.93101≦q[68]≦0.93103

0.93705≦q[69]≦0.93707

0.94270≦q[70]≦0.94272

0.94800≦q[71]≦0.94802

0.95295≦q[72]≦0.95297

0.95758≦q[73]≦0.95760

0.96190≦q[74]≦0.96192

0.96593≦q[75]≦0.96595

0.96968≦q[76]≦0.96970

0.97317≦q[77]≦0.97319

0.97641≦q[78]≦0.97643

0.97940≦q[79]≦0.97942

0.98217≦q[80]≦0.98219

0.98472≦q[81]≦0.98474

0.98706≦q[82]≦0.98708

0.98919≦q[83]≦0.98921

0.99113≦q[84]≦0.99115

0.99288≦q[85]≦0.99290

0.99444≦q[86]≦0.99446

0.99583≦q[87]≦0.99585

0.99704≦q[88]≦0.99706

0.99809≦q[89]≦0.99811

0.99896≦q[90]≦0.99898

0.99967≦q[91]≦0.99969

1.00023≦q[92]≦1.00025

1.00062≦q[93]≦1.00064

1.00086≦q[94]≦1.00088

1.00093≦q[95]≦1.00095

1.00086≦q[96]≦1.00088

1.00062≦q[97]≦1.00064

1.00023≦q[98]≦1.00025

0.99967≦q[99]≦0.99969

0.99896≦q[100]≦0.99898

0.99809≦q[101]≦0.99811

0.99704≦q[102]≦0.99706

0.99583≦q[103]≦0.99585

0.99444≦q[104]≦0.99446

0.99288≦q[105]≦0.99290

0.99113≦q[106]≦0.99115

0.98919≦q[107]≦0.98921

0.98706≦q[108]≦0.98708

0.98472≦q[109]≦0.98474

0.98217≦q[110]≦0.98219

0.97940≦q[111]≦0.97942

0.97641≦q[112]≦0.97643

0.97317≦q[113]≦0.97319

0.96968≦q[114]≦0.96970

0.96593≦q[115]≦0.96595

0.96190≦q[116]≦0.96192

0.95758≦q[117]≦0.95760

0.95295≦q[118]≦0.95297

0.94800≦q[119]≦0.94802

0.94270≦q[120]≦0.94272

0.93705≦q[121]≦0.93707

0.93101≦q[122]≦0.93103

0.92457≦q[123]≦0.92459

0.91769≦q[124]≦0.91771

0.91035≦q[125]≦0.91037

0.90252≦q[126]≦0.90254

0.89416≦q[127]≦0.89418

0.29117≦q[128]≦0.29119

0.27899≦q[129]≦0.27901

0.26711≦q[130]≦0.26713

0.25549≦q[131]≦0.25551

0.24412≦q[132]≦0.24414

0.23300≦q[133]≦0.23302

0.22211≦q[134]≦0.22213

0.21143≦q[135]≦0.21145

0.20095≦q[136]≦0.20097

0.19067≦q[137]≦0.19069

0.18058≦q[138]≦0.18060

0.17066≦q[139]≦0.17068

0.16091≦q[140]≦0.16093

0.15132≦q[141]≦0.15134

0.14189≦q[142]≦0.14191

0.13259≦q[143]≦0.13261

0.12344≦q[144]≦0.12346

0.11442≦q[145]≦0.11444

0.10552≦q[146]≦0.10554

0.09675≦q[147]≦0.09677

0.08809≦q[148]≦0.08811

0.07954≦q[149]≦0.07956

0.07110≦q[150]≦0.07112

0.06275≦q[151]≦0.06277

0.05451≦q[152]≦0.05453

0.04635≦q[153]≦0.04637

0.03828≦q[154]≦0.03830

0.03030≦q[155]≦0.03032

0.02240≦q[156]≦0.02242

0.01458≦q[157]≦0.01460

0.00683≦q[158]≦0.00685

−0.00084≦q[159]≦−0.00082

−0.00845≦q[160]≦−0.00843

−0.01598≦q[161]≦−0.01596

−0.02345≦q[162]≦−0.02343

−0.03085≦q[163]≦−0.03083

−0.03819≦q[164]≦−0.03817

−0.04547≦q[165]≦−0.04545

−0.05269≦q[166]≦−0.05267

−0.05984≦q[167]≦−0.05982

−0.06694≦q[168]≦−0.06692

−0.07397≦q[169]≦−0.07395

−0.08095≦q[170]≦−0.08093

−0.08786≦q[171]≦−0.08784

−0.09471≦q[172]≦−0.09469

−0.10149≦q[173]≦−0.10147

−0.10821≦q[174]≦−0.10819

−0.11486≦q[175]≦−0.11484

−0.12144≦q[176]≦−0.12142

−0.12794≦q[177]≦−0.12792

−0.13437≦q[178]≦−0.13435

−0.14071≦q[179]≦−0.14069

−0.14697≦q[180]≦−0.14695

−0.15313≦q[181]≦−0.15311

−0.15919≦q[182]≦−0.15917

−0.16514≦q[183]≦−0.16512

−0.17097≦q[184]≦−0.17095

−0.17668≦q[185]≦−0.17666

−0.18226≦q[186]≦−0.18224

−0.18768≦q[187]≦−0.18766

−0.19295≦q[188]≦−0.19293

−0.19804≦q[189]≦−0.19802

−0.20294≦q[190]≦−0.20292

−0.20764≦q[191]≦−0.20762

Even more accurately, the filter coefficients q(v) can be expressed by the following equations for the integer v in the range between 0 and 191, wherein according to the requirements and specifications of special implementations, the prototype filter coefficients may deviate from the following equations either individually or from the maximum absolute value typically by 10%, 5% or 2% and preferably by 1% or 0.1%:

q[0]=−0.2029343380 q[1]=−0.1980331588 q[2]=−0.1929411519 q[3]=−0.1876744222 q[4]=−0.1822474011 q[5]=−0.1766730202 q[6]=−0.1709628636 q[7]=−0.1651273005 q[8]=−0.1591756024 q[9]=−0.1531160455 q[10]=−0.1469560005 q[11]=−0.1407020132 q[12]=−0.1343598738 q[13]=−0.1279346790 q[14]=−0.1214308876 q[15]=−0.1148523686 q[16]=−0.1082024454 q[17]=−0.1014839341 q[18]=−0.0946991783 q[19]=−0.0878500799 q[20]=−0.0809381268 q[21]=−0.0739644174 q[22]=−0.0669296831 q[23]=−0.0598343081 q[24]=−0.0526783466 q[25]=−0.0454615388 q[26]=−0.0381833249 q[27]=−0.0308428572 q[28]=−0.0234390115 q[29]=−0.0159703957 q[30]=−0.0084353584 q[31]=−0.0008319956 q[32]=0.0068418435 q[33]=0.0145885527 q[34]=0.0224107648 q[35]=0.0303113495 q[36]=0.0382934126 q[37]=0.0463602959 q[38]=0.0545155789 q[39]=0.0627630810 q[40]=0.0711068657 q[41]=0.0795512453 q[42]=0.0881007879 q[43]=0.0967603259 q[44]=0.1055349658 q[45]=0.1144301000
q[46]=0.1234514222
q[47]=0.1326049434
q[48]=0.1418970123
q[49]=0.1513343370
q[50]=0.1609240126
q[51]=0.1706735517
q[52]=0.1805909194
q[53]=0.1906845753
q[54]=0.2009635191
q[55]=0.2114373458
q[56]=0.2221163080
q[57]=0.2330113868
q[58]=0.2441343742
q[59]=0.2554979664
q[60]=0.2671158700
q[61]=0.2790029236
q[62]=0.2911752349
q[63]=0.3036503350
q[64]=0.9025275713
q[65]=0.9103585196
q[66]=0.9176977825
q[67]=0.9245760683
q[68]=0.9310214581
q[69]=0.9370596739
q[70]=0.9427143143
q[71]=0.9480070606
q[72]=0.9529578566
q[73]=0.9575850672
q[74]=0.9619056158
q[75]=0.9659351065
q[76]=0.9696879297
q[77]=0.9731773547
q[78]=0.9764156119
q[79]=0.9794139640
q[80]=0.9821827692
q[81]=0.9847315377 q[82]=0.9870689790
q[83]=0.9892030462
q[84]=0.9911409728
q[85]=0.9928893067
q[86]=0.9944539395
q[87]=0.9958401318
q[88]=0.9970525352
q[89]=0.9980952118
q[90]=0.9989716504
q[91]=0.9996847806
q[92]=1.0002369837
q[93]=1.0006301028
q[94]=1.0008654482
q[95]=1.0009438063
q[96]=1.0008654482
q[97]=1.0006301028
q[98]=1.0002369837
q[99]=0.9996847806
q[100]=0.9989716504
q[101]=0.9980952118
q[102]=0.9970525352
q[103]=0.9958401318
q[104]=0.9944539395
q[105]=0.9928893067
q[106]=0.9911409728
q[107]=0.9892030462
q[108]=0.9870689790
q[109]=0.9847315377
q[110]=0.9821827692
q[111]=0.9794139640
q[112]=0.9764156119
q[113]=0.9731773547
q[114]=0.9696879297
q[115]=0.9659351065
q[116]=0.9619056158
q[117]=0.9575850672
q[118]=0.9529578566 q[119]=0.9480070606
q[120]=0.9427143143
q[121]=0.9370596739
q[122]=0.9310214581
q[123]=0.9245760683
q[124]=0.9176977825
q[125]=0.9103585196
q[126]=0.9025275713
q[127]=0.8941712974
q[128]=0.2911752349
q[129]=0.2790029236
q[130]=0.2671158700
q[131]=0.2554979664
q[132]=0.2441343742
q[133]=0.2330113868
q[134]=0.2221163080
q[135]=0.2114373458
q[136]=0.2009635191
q[137]=0.1906845753
q[138]=0.1805909194
q[139]=0.1706735517
q[140]=0.1609240126
q[141]=0.1513343370
q[142]=0.1418970123
q[143]=0.1326049434
q[144]=0.1234514222
q[145]=0.1144301000
q[146]=0.1055349658
q[147]=0.0967603259
q[148]=0.0881007879
q[149]=0.0795512453
q[150]=0.0711068657
q[151]=0.0627630810
q[152]=0.0545155789
q[153]=0.0463602959
q[154]=0.0382934126
q[155]=0.0303113495 q[156]=0.0224107648
q[157]=0.0145885527
q[158]=0.0068418435
q[159]=−0.0008319956
q[160]=−0.0084353584
q[161]=−0.0159703957
q[162]=−0.0234390115
q[163]=−0.0308428572
q[164]=−0.0381833249
q[165]=−0.0454615388
q[166]=−0.0526783466
q[167]=−0.0598343081
q[168]=−0.0669296831
q[169]=−0.0739644174
q[170]=−0.0809381268
q[171]=−0.0878500799
q[172]=−0.0946991783
q[173]=−0.1014839341
q[174]=−0.1082024454
q[175]=−0.1148523686
q[176]=−0.1214308876
q[177]=−0.1279346790
q[178]=−0.1343598738
q[179]=−0.1407020132
q[180]=−0.1469560005
q[181]=−0.1531160455
q[182]=−0.1591756024
q[183]=−0.1651273005
q[184]=−0.1709628636
q[185]=−0.1766730202
q[186]=−0.1822474011
q[187]=−0.1876744222
q[188]=−0.1929411519
q[189]=−0.1980331588
q[190]=−0.2029343380
q[191]=−0.2076267137

Hence, the present invention relates to the application of an arbitrary filter to a signal which is available in the transform domain of a complex exponential modulated filter bank, when this filter bank is designed to give virtually alias free performance of operations like equalization, spectral envelope adjustment, frequency selective panning, or frequency selective spatialization of audio signals. The present invention permits to efficiently transform a given finite impulse response (FIR) filter in the time domain into a set of shorter FIR filters, to be applied with one filter for each subband of the filter bank.

The present invention also teaches how to convert a given discrete time domain filter into to a set of subband domain filters. The result is that any given filter can be implemented with a high degree of accuracy in the subband domain of a complex exponential modulated filter bank. In a preferred embodiment, the filter converter consists of a second complex exponential modulated analysis filter bank. For the special case of filters that implement a pure delay, the methods of the present invention coincides with that of PCT/EP2004/004607 "Advanced processing based on a complex-exponential modulated filterbank and adaptive time framing".

Furthermore, the present invention comprises the following features:

A method for obtaining a high quality approximation to the filtering of a discrete-time input signal with a given filter, comprising the steps of
analyzing the input signal with a downsampled complex analysis filter bank in order to obtain a multitude of subband signals,
filtering each subband signal with a subband filter, where the multitude of subband filters are obtained from the given filter by means of a filter converter,
synthesizing an output signal from the filtered subband signals with a downsampled complex synthesis filter bank.

A method according to the above where the filter converter consists of a downsampled complex analysis filter bank.

An apparatus for performing a method for obtaining a high quality approximation to the filtering of a discrete-time input signal with a given filter, the method comprising the steps of
analyzing the input signal with a downsampled complex analysis filter bank in order to obtain a multitude of subband signals,
filtering each subband signal with a subband filter, where the multitude of subband filters are obtained from the given filter by means of a filter converter,
synthesizing an output signal from the filtered subband signals with a downsampled complex synthesis filter bank.

A computer program having instructions for performing, when running on a computer, a method for obtaining a high quality approximation to the filtering of a discrete-time input signal with a given filter, the method comprising the steps of
analyzing the input signal with a downsampled complex analysis filter bank in order to obtain a multitude of subband signals,
filtering each subband signal with a subband filter, where the multitude of subband filters are obtained from the given filter by means of a filter converter,
synthesizing an output signal from the filtered subband signals with a downsampled complex synthesis filter bank.

Adaptation for Real Cosine Modulated Filter Banks

Whereas the above derivation is based on complex modulated filter banks, a note can be made here for the critically sampled real representation obtained by a cosine modulated filter bank defined by taking the real part of the subband samples (1) for an appropriate phase factor θ. In this case it is no longer feasible to use the in-band subband filtering method (3) to obtain a good approximation to a given filter. However, due to the assumptions made on the prototype filter response, a generalization to a multiband filter of the type $$d_n(k) = \sum_{r=-1}^{1} \sum_{l} g_n^r(l) c_{n+r}(k-l), \tag{22}$$

will be applicable, (with obvious modifications for the first and last subbands). Due to the critical sampling there is much less freedom in the construction of the filter mask $g_n^r(l)$. One has to do the following, which is obvious for those skilled in the art. For each m=0, 1, ..., L−1, use the elementary subband signal $d_n(k)=\delta[n-m]\delta[k]$ as input to the real synthesis bank, and filter the resulting output y(v) with the filter h(v) to get the filtered synthesis waveform z(v). Now use this filtered waveform as input to the real analysis bank. The resulting subband signal carries the coefficients of the masks $g_n^r(l)$ for n+r=m. Some reduction in work necessary for the filter is obtained by observing that the three cases m=3κ+ϵ for ϵ=0, 1, 2 can be processed in parallel by feeding the first synthesis bank with all the corresponding elementary subband signals for each case. Thus the real valued filter converter comprises three real synthesis and three real analysis bank operations. This parallel computation represents an implementation short cut for real valued filter converter for the case of a QMF band with good side lope suppression.

Figure 9:
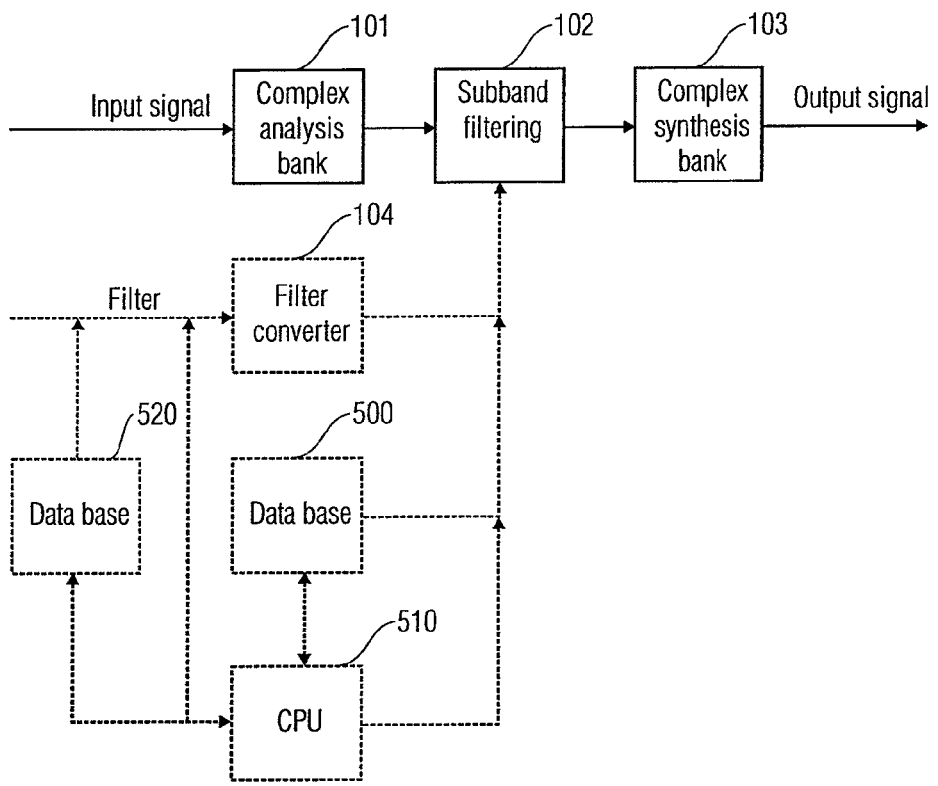
FIG. 9 illustrates a preferred embodiment of a filter apparatus comprising an optional embodiment of a filter generator and further components.

FIG. 9 illustrates an embodiment of an inventive filter apparatus for filtering a time domain input signal of an inventive filter apparatus to obtain a time domain output signal. As already mentioned in the context of FIG. 1a, the filter apparatus of FIG. 9 comprises a complex analysis filter bank 101, a subband filtering 102 and a complex synthesis filter bank 103, which outputs the time domain output signal.

While FIG. 1 shows a system comprising an embodiment of an inventive filter apparatus along with an embodiment of a filter generator 104, the filter apparatus shown in FIG. 9 comprises only as an option a filter converter 104, which provides the subband filtering 102 with the intermediate filter definition signal, for instance in the form of the filter taps or the impulse response for each of the intermediate filters 190 of the subband filtering 102. The filter apparatus shown in FIG. 9, comprises additional optional components, which can provide the subband filtering 102 with the filter taps for the plurality of intermediate filters 190 of the subband filtering 102.

As an example, the filter taps can also be taken from an optional data base 500, which is connected to the subband filtering 102. In one embodiment, the data base 500 comprises the complex valued filter taps of the intermediate filters 190. The data base can be implemented as a memory system, for instance in the form of a non-volatile memory system or volatile memory system depending on the concrete implementation. Hence, memory solutions for the data base 500 comprise ROM (ROM=read only memory), RAM (RAM=random access memory), flash memory, magnetical memory, optical memory or other memory systems.

Depending on the concrete implementation, a processor or a CPU (CPU=central processing unit) 510 can access the data base and provide the filter taps to the subband filtering 102 or can also access the data base to provide the corresponding filter taps to the intermediate filters of the subband filtering 102. Hence, such an embodiment comprises a data base 500 from which the filter taps for the subband filtering 102 can be taken.

In a further embodiment of an inventive filter apparatus, which is also depicted as an option in FIG. 9, the CPU 510 is capable of on-line calculating the filter taps. In such an embodiment, the CPU 510 accesses the data base 500 according to a set of parameters provided by the user and/or according to a set of parameters, which are based on further circumstances, reads one or more sets of filter taps for the intermediate filters of the subband filtering 102 and calculates, optionally accompanied by an interpolation scheme or another estimation scheme, the desired intermediate filter taps and provides them to the subband filtering 102. In a further embodiment, the CPU 510 or another processor or computer system provides the filter taps of the intermediate filters 190 to the subband filtering 102 without accessing a data base 500. In such an embodiment, the CPU 510 or another processor calculates the filter taps and provides them to the subband filtering 102. Examples for such an embodiment will be explained more closely with respect to FIG. 10.

In a further embodiment depicted in FIG. 9, the CPU 510 accesses a further data base 520, reads one or more filter definition signals (e.g. in the form of impulse response signals corresponding to filter characteristic in the time domain), calculates an effective filter definition signal, for instance an appropriate impulse response, and provides the results of this computation to the filter converter 104. In this embodiment, the filter converter 104 then provides the subband filtering 102 with the appropriate filter taps for the intermediate filters 190. Hence, in this embodiment, the filter converter 104 generates the effective subband filters or intermediate filters applied to each individual subband filters of each individual subband signal inside the subband filtering 102 leading to a filtering effect audibly indistinguishable from a corresponding filter applied to the time domain input signal (input signal). As consequence, this embodiment is also capable of on-line calculating the filter taps via the filter converter 104.

An example might for instance be a device, which calculates the taps of the intermediate filters 190 of the subband filtering 102 according to a set of parameters for instance provided by the user, wherein the parameter basis is so large, that an effective predetermination of the filter taps, optionally accompanied by some sort of interpolation scheme, would not lead to the desired results.

A more concrete application comes for instance of the field of dynamic chance of HRTF filters in one domain to be converted to the subband or QMF domain. As mentioned before, this is for instance relevant in applications involving a head-tracker in which the data base 520 is an HRTF data base comprising the time impulse responses of the HRTF filters. As the HRTF filters usually have very long impulse responses, the use of such a scheme is especially interesting, as the taps for the intermediate filters 190 or the QMF taps are complex. Storing the data base in this domain would roughly double the memory requirements compared to the memory requirement of storing the impulse responses in the time domain. However, the advantage of the reduced memory requirement can also be employed without having a CPU 510 which calculates the impulse response provided to the filter converter 504. Instead, the data base 520 can be simply be prompted to output the corresponding definition signal, which might be an impulse response in the time domain to the filter converter 104.

Figure 10:
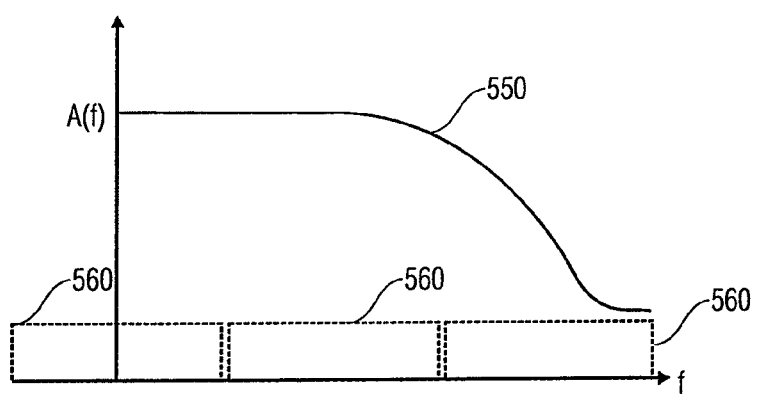
FIG. 10 illustrates a filter characteristic along with several frequency bands for different subbands.

In FIG. 10, an amplitude/frequency characteristic 550 is illustrated in the frequency domain. In some applications, as explained before, the filter coefficients or filter taps are the intermediate filters 190 of the subband filtering 102 can be stored in the data base like the data base 500 of FIG. 9. Alternatively or additionally, for some applications, the filter taps of the intermediate filters can also be calculated by the CPU 510 of FIG. 9. In the case of a special effect filtering or a lower quality signal processing, in which aliasing effects might become tolerable (at least to some extend), the filter taps of the intermediate filters 190 after subband filtering 102 can be estimated without a filter converter 104 or another embodiment of a filter generator. Possible applications especially comprise voice transmission over low quality lines, like telephones or small band radio communications. Hence, in these applications a determination of the filter taps corresponding the transfer function 550 of FIG. 10 or another amplitude/frequency characteristic into several subbands 560 with different subband frequencies can be carried out without employing an inventive filter converter.

Figure 11:
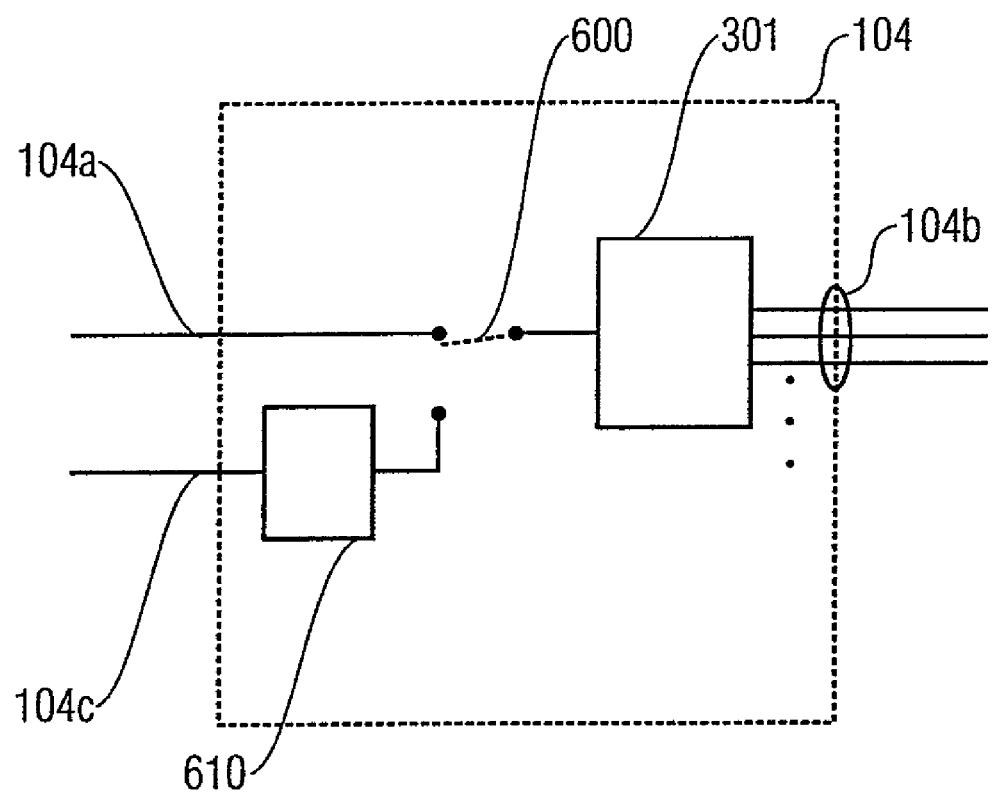
FIG. 11 illustrates a preferred embodiment of a filter generator.

FIG. 11 shows an embodiment of an inventive filter converter 104. As previously outlined in the context of FIG. 3, the filter converter 104 comprises a complex analysis filter bank 301 to which a (real valued) impulse response signal indicative of an amplitude/frequency filter characteristic can be supplied via an input 104a and via an optional switch 600. As outlined before, the complex analysis filter bank 301 converts the impulse response signal into a plurality of complex valued subband signals and the intermediate filter definition signal output at an output 104b of the filter converter. As indicated in FIG. 1a and FIG. 9, the output 104b of the filter converter 104 can be connected to a subband filtering 102.

As already mentioned earlier, each of the complex valued subband signals of the complex modulated filter bank 301 corresponds to an impulse response for one of the intermediate filters 190 for a subband signal in the subband filtering 102 shown in FIGS. 1a and 9. Typically, the complex valued subband signals are significantly shorter than the impulse response signal of the filter characteristic provided at the input 104a in the time domain. Furthermore, typically at least one of the complex valued subband signals output at the output 104b comprises at least two different non-vanishing values. Especially the last feature distinguishes the output of the filter converter 104 from a simple gain adjustment in the frame work of filtering using a direct Fourier transform procedure.

If, however, the filter converter 104 is not provided with an impulse response signal indicative of an amplitude/frequency filter characteristic, but a filter definition signal, which comprises at least one of an amplitude/frequency filter characteristic, a phase/frequency filter characteristic or the filter taps in the time domain or another domain of a filter, the filter converter 104 comprises an impulse response generator 610 for converting the filter definition signal into the impulse response signal, which is then provided via the optional switch 600 to the complex analysis filter bank 301. In a concrete implementation, the impulse response generator 610 can for instance calculate the impulse response signal provided to the complex analysis filter bank 301 by superposition of real valued oscillations (Fourier synthesis), wherein the amplitude characteristics and the phase characteristics of the intended filter to be transferred into the complex subband domain are regarded as defined by the definition signal provided to the input 104c. In other words, if at least one of an amplitude/frequency characteristic and a phase/frequency characteristic is applied to the impulse response generator 610, an impulse response signal can be computed by the impulse response generator 610 by supposition of (harmonic) oscillations considering the amplitude and phase relations as defined by the filter definition signal.

Possible applications of both embodiments of the filter apparatus and the filter generator and especially in the field of high quality audio coding and decoding.

Recent developments in audio coding have provided means to obtain a multi-channel signal impression over stereo headphones. This is commonly done by downmixing a multi-channel signal to stereo using the original multi-channel signal and HRTF filters. It has been shown in prior art that the parametric multi-channel audio decoder can be combined with a binaural downmix algorithm making it possible to render a multi-channel signal over headphones without the need for first re-creating the multi-channel signal from the transmitted downmix signal, and subsequently downmixing it again by means of the HRTF filters. However, this requires that the parameters for recreating the multi-channel signal (e.g. IID, CLD parameters) are combined with the HRTF filters, which in turn requires a parameterization of the HRTF filters. This requirement for a parameterization of the HRTF filters imposes high limitation on the system, since HRTF filters can be long and thus very hard to correctly model with a parametric approach. This limitation makes it impossible to use long HRTF filters for combined parametric multi-channel and binaural downmix decoders. The crucial algorithmic component required to obtain a proper combination of multi-channel parameters and HRTF filters is to have access to a representation of the given HRTF filters in the subband domain assumed by the spatial parameters. This is exactly what is offered by the embodiments of the present invention. Once this representation is available, the HRTF filters can be combined into 2N filters as a function of the parametric multi-channel representation. This gives a significant advantage in terms of computational complexity over the method that first recreates the M channels and then applies 2M filtering operations.

An example of a different application of the method employed by embodiments of the current invention is the efficient compensation for non-perfect audio rendering devices for audio content coded in the MPEG HE-AAC format [ISO/IEC 14496-3:2001/AMD1:2003]. Such advanced filtering steps, possibly including cross talk cancellation, can be applied directly in the subband domain prior to the time domain synthesis.

Other developments in audio coding has made methods available to recreate a multi-channel representation of an audio signal based on a stereo (or mono) signal and corresponding control data. These methods differ substantially from older matrix based solution such as Dolby® Prologic, since additional control data is transmitted to control the re-creation, also referred to as up-mix, of the surround channels based on the transmitted mono or stereo channels.

Hence, such a parametric multi-channel audio decoder, e.g. MPEG Surround reconstructs N channels based on M transmitted channels, where N>M, and the additional control data. The additional control data represents a significantly lower data rate than that required for transmission of all N channels, making the coding very efficient while at the same time ensuring compatibility with both M channel devices and N channel devices. [J. Breebaart et al. "MPEG spatial audio coding/MPEG Surround: overview and current status", Proc. 119th AES convention, New York, USA, October 2005, Preprint 6447].

These parametric surround coding methods usually comprise a parameterization of the surround signal based on Channel Level Difference (CLD) and Inter-channel coherence/cross-correlation (ICC). These parameters describe power ratios and correlation between channel pairs in the up-mix process. Further Channel Prediction Coefficients (CPC) are also used in prior art to predict intermediate or output channels during the up-mix procedure.

Depending on certain implementation requirements of the inventive methods, the inventive methods can be implemented in hardware or in software. The implementation can be performed using a digital storage medium, in particular a disc, CD or a DVD having an electronically readable control signal stop thereon, which cooperates with a programmable computer system in such that an embodiment of the inventive methods is performed. Generally, an embodiment of the present invention is, therefore, a computer program product with a program code stored on an machine-readable carrier, the program code being operative for performing the inventive methods when the computer program product runs on a computer or a processor. In other words, embodiments of the inventive methods are, therefore, a computer program having a program code for performing at least one of the inventive methods when the computer program runs of a computer.

While the foregoing has been particularly shown and described with references to particular embodiments thereof, it will be understood by those skilled in the art that various other changes in the form and details maybe made without departing from the spiritual scope thereof. It is to be understood that various changes may be made in adapting to different embodiments without departing from the broader concept disclosed herein and comprehend by the claims that follows.

The invention claimed is:

1. Filter apparatus for filtering a time domain input signal to obtain a time domain output signal, which is a representation of the time domain input signal filtered using a filter characteristic having an non-uniform amplitude/frequency characteristic, comprising:
 a complex analysis filter bank for generating a plurality of complex subband signals from the time domain input signals;
 a plurality of intermediate filters, wherein at least one of the intermediate filters of the plurality of the intermediate filters has a non-uniform amplitude/frequency characteristic, wherein the plurality of intermediate filters have a shorter impulse response compared to an impulse response of a filter having the filter characteristic, and wherein the non-uniform amplitude/frequency characteristics of the plurality of intermediate filters together represent the non-uniform filter characteristic; and
 a complex synthesis filter bank for synthesizing the output of the intermediate filters to obtain the time domain output signal,
 wherein at least one of the complex analysis filter bank, an intermediate filter of the plurality of intermediate filters, and the complex synthesis filter bank comprises a hardware implementation.

2. Filter apparatus according to claim 1, wherein at least one of the immediate filters has a low pass filter characteristic, a high pass filter characteristic, a band pass filter characteristic, a band rejection filter characteristic or a notch filter characteristic.

3. Filter apparatus according to claim 1, wherein the intermediate filters of the plurality of intermediate filters are finite impulse response filters.

4. Filter apparatus according to claim 1, wherein each intermediate filter is operative to have an impulse response depending on an intermediate filter definition signal.

5. Filter apparatus according to claim 4, wherein the plurality of intermediate filter is operative to receive the intermediate filter definition signal from a data base or from a processor.

6. Filter apparatus according to claim 4, wherein the plurality of intermediate filters is operative to receive the intermediate filter definition signal from a filter generator comprising a complex modulated filter bank for filtering an impulse response signal indicative of an amplitude/frequency filter characteristic in a time domain to obtain a plurality of complex valued subband signals as the intermediate filter definition signal, wherein each complex valued subband signal of the complex modulated filter bank corresponds to an impulse response for one intermediate filter, wherein at least one of the complex valued subband signals comprises at least two different non-vanishing values, and wherein each complex valued subband signal is shorter than the impulse response signal.

7. Filter apparatus according to claim 1, wherein the complex analysis filter bank is operative to output L complex subband signals, wherein the plurality of intermediate filters comprises L intermediate filters, wherein the complex synthesis filter bank is operative to synthesize the output of the L intermediate filters, and wherein L is a positive integer greater than 1.

8. Filter apparatus according to claim 7, wherein the complex analysis filter bank, the plurality of intermediate filters and the complex synthesis filter bank is operative to have L=64.

9. Filter apparatus according to claim 7, wherein the plurality of intermediate filters is operative to filter the complex subband signals based on the equation $$d_n(k) = \sum_l g_n(l) c_n(k-l) \quad (3)$$

wherein n is an integer in the range from 0 to (L−1) indicating an index of the subband signals, wherein L and k are integers, wherein $d_n(k)$ is the output of the intermediate filter (190) of the subband signal with the index n, wherein $c_n(k)$ is the subband signal with the index n, and wherein $g_n(l)$ is the impulse response of the intermediate filter for the subband signal with the index n.

10. Filter apparatus according to claim 7, wherein the intermediate filter with an index n has an impulse response $g_n(k)$, which is based on the equation $$g_n(k) = \sum_{v=-\infty}^{\infty} h(v+kL) q(v) \exp\left(-i\frac{\pi}{L}\left(n+\frac{1}{2}\right)v\right) \quad (12)$$

wherein n is an integer in the range from 0 to (L−1) indicating the index of the subband signal, wherein k and v are integers, wherein h(v) is the response of a filter having the filter characteristic, wherein π=3.1415926 . . . is the circular number, wherein i=√−1 is the complex unit, and wherein q(v) are filter taps of a real valued prototype filter.

11. Filter apparatus according to claim 7, wherein at least one of the intermediate filters with an index n has an impulse response $g_n(k)$, which is based on the equation $$g_n(l) = \sum_{v=0}^{191} \tilde{h}(v+64\cdot(l-2)) \cdot q(v) \cdot \exp\left(-i\frac{\pi}{64}\left(n+\frac{1}{2}\right)(v-95)\right) \quad (20)$$

wherein $$\tilde{h}(v) = \begin{cases} h(v), & v = 0, 1, \ldots, N_h - 1, \\ 0, & \text{otherwise} \end{cases} \quad (18)$$

wherein $N_h$ is the length of the impulse response h(v) of a filter having the filter characteristic, wherein π=3.1415926. . . is the circular number, wherein i=√−1 is the complex unit, and wherein q(v) are filter taps of a real valued prototype filter.

12. Filter apparatus according to claim 10, wherein the intermediate filters are adapted so that the prototype filter taps q(v) fulfill for integers v from 0 to 191 the relations:

−0.204≦q[0]≦−0.202

−0.199≦q[1]≦−0.197

−0.194≦q[2]≦−0.192

−0.189≦q[3]≦−0.187

−0.183≦q[4]≦−0.181

−0.178≦q[5]≦−0.176

−0.172≦q[6]≦−0.170

−0.166≦q[7]≦−0.164

−0.160≦q[8]≦−0.158

−0.154≦q[9]≦−0.152

−0.148≦q[10]≦−0.146

−0.142≦q[11]≦−0.140

−0.135≦q[12]≦−0.133

−0.129≦q[13]≦−0.127

−0.122≦q[14]≦−0.120

−0.116≦q[15]≦−0.114

−0.109≦q[16]≦−0.107

−0.102≦q[17]≦−0.100

−0.096≦q[18]≦−0.100

−0.089≦q[19]≦−0.094

−0.082≦q[20]≦−0.087

−0.075≦q[21]≦−0.080

−0.068≦q[22]≦−0.066

−0.061≦q[23]≦−0.059

−0.054≦q[24]≦−0.052

−0.046≦q[25]≦−0.044

−0.039≦q[26]≦−0.037

−0.032≦q[27]≦−0.030

−0.024≦q[28]≦−0.022

−0.017≦q[29]≦−0.015

$-0.009 \leq q[30] \leq -0.007$ $-0.002 \leq q[31] \leq 0.000$ $0.006 \leq q[32] \leq 0.008$ $0.014 \leq q[33] \leq 0.016$ $0.021 \leq q[34] \leq 0.023$ $0.029 \leq q[35] \leq 0.031$ $0.037 \leq q[36] \leq 0.039$ $0.045 \leq q[37] \leq 0.047$ $0.054 \leq q[38] \leq 0.056$ $0.062 \leq q[39] \leq 0.064$ $0.070 \leq q[40] \leq 0.072$ $0.079 \leq q[41] \leq 0.081$ $0.087 \leq q[42] \leq 0.089$ $0.096 \leq q[43] \leq 0.098$ $0.105 \leq q[44] \leq 0.107$ $0.113 \leq q[45] \leq 0.115$ $0.122 \leq q[46] \leq 0.124$ $0.132 \leq q[47] \leq 0.134$ $0.141 \leq q[48] \leq 0.143$ $0.150 \leq q[49] \leq 0.152$ $0.160 \leq q[50] \leq 0.162$ $0.170 \leq q[51] \leq 0.172$ $0.180 \leq q[52] \leq 0.182$ $0.190 \leq q[53] \leq 0.192$ $0.200 \leq q[54] \leq 0.202$ $0.210 \leq q[55] \leq 0.212$ $0.221 \leq q[56] \leq 0.223$ $0.232 \leq q[57] \leq 0.234$ $0.243 \leq q[58] \leq 0.245$ $0.254 \leq q[59] \leq 0.256$ $0.266 \leq q[60] \leq 0.268$ $0.278 \leq q[61] \leq 0.280$ $0.290 \leq q[62] \leq 0.292$ $0.303 \leq q[63] \leq 0.305$ $0.902 \leq q[64] \leq 0.904$ $0.909 \leq q[65] \leq 0.911$ $0.917 \leq q[66] \leq 0.919$ $0.924 \leq q[67] \leq 0.926$ $0.930 \leq q[68] \leq 0.932$ $0.936 \leq q[69] \leq 0.938$ $0.942 \leq q[70] \leq 0.944$ $0.947 \leq q[71] \leq 0.949$ $0.952 \leq q[72] \leq 0.954$ $0.957 \leq q[73] \leq 0.959$ $0.961 \leq q[74] \leq 0.963$ $0.965 \leq q[75] \leq 0.967$ $0.969 \leq q[76] \leq 0.971$ $0.972 \leq q[77] \leq 0.974$ $0.975 \leq q[78] \leq 0.977$ $0.978 \leq q[79] \leq 0.980$ $0.981 \leq q[80] \leq 0.983$ $0.984 \leq q[81] \leq 0.986$ $0.986 \leq q[82] \leq 0.988$ $0.988 \leq q[83] \leq 0.990$ $0.990 \leq q[84] \leq 0.992$ $0.992 \leq q[85] \leq 0.994$ $0.993 \leq q[86] \leq 0.995$ $0.995 \leq q[87] \leq 0.997$ $0.996 \leq q[88] \leq 0.998$ $0.997 \leq q[891] \leq 0.999$ $0.998 \leq q[90] \leq 1.000$ $0.999 \leq q[91] \leq 1.001$ $0.999 \leq q[92] \leq 1.001$ $1.000 \leq q[93] \leq 1.002$ $1.000 \leq q[94] \leq 1.002$ $1.000 \leq q[95] \leq 1.002$ $1.000 \leq q[96] \leq 1.002$ $1.000 \leq q[97] \leq 1.002$ $0.999 \leq q[98] \leq 1.001$ $0.999 \leq q[99] \leq 1.001$ $0.998 \leq q[100] \leq 1.000$ $0.997 \leq q[101] \leq 0.999$ $0.996 \leq q[102] \leq 0.998$ $0.995 \leq q[103] \leq 0.997$ 0.993≦q[104]≦0.995

0.992≦q[105]≦0.994

0.990≦q[106]≦0.992

0.988≦q[107]≦0.990

0.986≦q[108]≦0.988

0.984≦q[109]≦0.986

0.981≦q[110]≦0.983

0.978≦q[111]≦0.980

0.975≦q[112]≦0.977

0.972≦q[113]≦0.974

0.969≦q[114]≦0.971

0.965≦q[115]≦0.967

0.961≦q[116]≦0.963

0.957≦q[117]≦0.959

0.952≦q[118]≦0.954

0.947≦q[119]≦0.949

0.942≦q[120]≦0.944

0.936≦q[121]≦0.938

0.930≦q[122]≦0.932

0.924≦q[123]≦0.926

0.917≦q[124]≦0.919

0.909≦q[125]≦0.911

0.902≦q[126]≦0.904

0.893≦q[127]≦0.895

0.290≦q[128]≦0.292

0.278≦q[129]≦0.280

0.266≦q[130]≦0.268

0.254≦q[131]≦0.256

0.243≦q[132]≦0.245

0.232≦q[133]≦0.234

0.221≦q[134]≦0.223

0.210≦q[135]≦0.212

0.200≦q[136]≦0.202

0.190≦q[137]≦0.192

0.180≦q[138]≦0.182

0.170≦q[139]≦0.172

0.160≦q[140]≦0.162

0.150≦q[141]≦0.152

0.141≦q[142]≦0.143

0.132≦q[143]≦0.134

0.122≦q[144]≦0.124

0.113≦q[145]≦0.115

0.105≦q[146]≦0.107

0.096≦q[147]≦0.098

0.087≦q[148]≦0.089

0.079≦q[149]≦0.081

0.070≦q[150]≦0.072

0.062≦q[151]≦0.064

0.054≦q[152]≦0.056

0.045≦q[153]≦0.047

0.037≦q[154]≦0.039

0.029≦q[155]≦0.031

0.021≦q[156]≦0.023

0.014≦q[157]≦0.016

0.006≦q[158]≦0.008

−0.002≦q[159]≦0.000

−0.00845≦q[160]≦−0.00843

−0.01598≦q[161]≦−0.01596

−0.02345≦q[162]≦−0.02343

−0.03085≦q[163]≦−0.03083

−0.03819≦q[164]≦−0.03817

−0.04547≦q[165]≦−0.04545

−0.05269≦q[166]≦−0.05267

−0.05984≦q[167]≦−0.05982

−0.06694≦q[168]≦−0.06692

−0.07397≦q[169]≦−0.07395

−0.08095≦q[170]≦−0.08093

−0.08786≦q[171]≦−0.08784

−0.09471≦q[172]≦−0.09469

−0.10149≦q[173]≦−0.10147

−0.10821≦q[174]≦−0.10819

−0.11486≦q[175]≦−0.11484

−0.12144≦q[176]≦−0.12142

−0.12794≦q[177]≦−0.12792

−0.13437≦q[178]≦−0.13435

−0.14071≦q[179]≦−0.14069

−0.14697≦q[180]≦−0.14695

−0.15313≦q[181]≦−0.15311

−0.15919≦q[182]≦−0.15917

−0.16514≦q[183]≦−0.16512

−0.17097≦q[184]≦−0.17095

−0.17668≦q[185]≦−0.17666

−0.18226≦q[186]≦−0.18224

−0.18768≦q[187]≦−0.18766

−0.19295≦q[188]≦−0.19293

−0.19804≦q[189]≦−0.19802

−0.20294≦q[190]≦−0.20292

−0.20764≦q[191]≦−0.20762.

13. Filter apparatus according to claim 10, wherein the intermediate filters are adapted so that the prototype filter taps q(ν) fulfill for integers ν from 0 to 191 the relations:

−0.20294≦q[0]≦−0.20292

−0.19804≦q[1]≦−0.19802

−0.19295≦q[2]≦−0.19293

−0.18768≦q[3]≦−0.18766

−0.18226≦q[4]≦−0.18224

−0.17668≦q[5]≦−0.17666

−0.17097≦q[6]≦−0.17095

−0.16514≦q[7]≦−0.16512

−0.15919≦q[8]≦−0.15917

−0.15313≦q[9]≦−0.15311

−0.14697≦q[10]≦−0.14695

−0.14071≦q[11]≦−0.14069

−0.13437≦q[12]≦−0.13435

−0.12794≦q[13]≦−0.12792

−0.12144≦q[14]≦−0.12142

−0.11486≦q[15]≦−0.11484

−0.10821≦q[16]≦−0.10819

−0.10149≦q[17]≦−0.10147

−0.09471≦q[18]≦−0.09469

−0.08786≦q[19]≦−0.08784

−0.08095≦q[20]≦−0.08093

−0.07397≦q[21]≦−0.07395

−0.06694≦q[22]≦−0.06692

−0.05984≦q[23]≦−0.05982

−0.05269≦q[24]≦−0.05267

−0.04547≦q[25]≦−0.04545

−0.03819≦q[26]≦−0.03817

−0.03085≦q[27]≦−0.03083

−0.02345≦q[28]≦−0.02343

−0.01598≦q[29]≦−0.01596

−0.00845≦q[30]≦−0.0.0843

−0.00084≦q[31]≦−0.00082

0.00683≦q[32]≦0.00685

0.01458≦q[33]≦0.01460

0.02240≦q[34]≦0.02242

0.03030≦q[35]≦0.03032

0.03828≦q[36]≦0.03830

0.04635≦q[37]≦0.04637

0.05451≦q[38]≦0.05453

0.06275≦q[39]≦0.06277

0.07110≦q[40]≦0.07112

0.07954≦q[41]≦0.07956

0.08809≦q[42]≦0.08811

0.09675≦q[43]≦0.09677

0.10552≦q[44]≦0.10554

0.11442≦q[45]≦0.11444

0.12344≦q[46]≦0.12346

0.13259≦q[47]≦0.13261

0.14189≦q[48]≦0.14191

0.15132≦q[49]≦0.15134

0.16091≦q[50]≦0.16093

0.17066≦q[51]≦0.17068

0.18058≦q[52]≦0.18060

0.19067≦q[53]≦0.19069

0.20095≦q[54]≦0.20097

0.21143≦q[55]≦0.21145

0.22211≦q[56]≦0.22213

0.23300≦q[57]≦0.23302

0.24412≦q[58]≦0.24414

0.25549≦q[59]≦0.25551

0.26711≦q[60]≦0.26713

0.27899≦q[61]≦0.27901

0.29117≦q[62]≦0.29119

0.30364≦q[63]≦0.30366

0.90252≦q[64]≦0.90254

0.91035≦q[65]≦0.91037

0.91769≦q[66]≦0.91771

0.92457≦q[67]≦0.92459

0.93101≦q[68]≦0.93103

0.93705≦q[69]≦0.93707

0.94270≦q[70]≦0.94272

0.94800≦q[71]≦0.94802

0.95295≦q[72]≦0.95297

0.95758≦q[73]≦0.95760

0.96190≦q[74]≦0.96192

0.96593≦q[75]≦0.96595

0.96968≦q[76]≦0.96970

0.97317≦q[77]≦0.97319

0.97641≦q[78]≦0.97643

0.97940≦q[79]≦0.97942

0.98217≦q[80]≦0.98219

0.98472≦q[81]≦0.98474

0.98706≦q[82]≦0.98708

0.98919≦q[83]≦0.98921

0.99113≦q[84]≦0.99115

0.99288≦q[85]≦0.99290

0.99444≦q[86]≦0.99446

0.99583≦q[87]≦0.99585

0.99704≦q[88]≦0.99706

0.99809≦q[89]≦0.99811

0.99896≦q[90]≦0.99898

0.99967≦q[91]≦0.99969

1.00023≦q[92]≦1.00025

1.00062≦q[93]≦1.00064

1.00086≦q[94]≦1.00088

1.00093≦q[95]≦1.00095

1.00086≦q[96]≦1.00088

1.00062≦q[97]≦1.00064

1.00023≦q[98]≦1.00025

0.99967≦q[99]≦0.99969

0.99896≦q[100]≦0.99898

0.99809≦q[101]≦0.99811

0.99704≦q[102]≦0.99706

0.99583≦q[103]≦0.99585

0.99444≦q[104]≦0.99446

0.99288≦q[105]≦0.99290

0.99113≦q[106]≦0.99115

0.98919≦q[107]≦0.98921

0.98706≦q[108]≦0.98708

0.98472≦q[109]≦0.98474

0.98217≦q[110]≦0.98219

0.97940≦q[111]≦0.97942

0.97641≦q[112]≦0.97643

0.97317≦q[113]≦0.97319

0.96968≦q[114]≦0.96970

0.96593≦q[115]≦0.96595

0.96190≦q[116]≦0.96192

0.95758≦q[117]≦0.95760

0.95295≦q[118]≦0.95297

0.94800≦q[119]≦0.94802

0.94270≦q[120]≦0.94272

0.93705≦q[121]≦0.93707

0.93101≦q[122]≦0.93103

0.92457≦q[123]≦0.92459

0.91769≦q[124]≦0.91771

0.91035≦q[125]≦0.91037

0.90252≦q[126]≦0.90254

0.89416≦q[127]≦0.89418

0.29117≦q[128]≦0.29119

0.27899≦q[129]≦0.27901

0.26711≦q[130]≦0.26713

0.25549≦q[131]≦0.25551

0.24412≦q[132]≦0.24414

0.23300≤q[133]≤0.23302

0.22211≤q[134]≤0.22213

0.21143≤q[135]≤0.21145

0.20095≤q[136]≤0.20097

0.19067≤q[137]≤0.19069

0.18058≤q[138]≤0.18060

0.17066≤q[139]≤0.17068

0.16091≤q[140]≤0.16093

0.15132≤q[141]≤0.15134

0.14189≤q[142]≤0.14191

0.13259≤q[143]≤0.13261

0.12344≤q[144]≤0.12346

0.11442≤q[145]≤0.11444

0.10552≤q[146]≤0.10554

0.09675≤q[147]≤0.09677

0.08809≤q[148]≤0.08811

0.07954≤q[149]≤0.07956

0.07110≤q[150]≤0.07112

0.06275≤q[151]≤0.06277

0.05451≤q[152]≤0.05453

0.04635≤q[153]≤0.04637

0.03828≤q[154]≤0.03830

0.03030≤q[155]≤0.03032

0.02240≤q[156]≤0.02242

0.01458≤q[157]≤0.01460

0.00683≤q[158]≤0.00685

−0.00084≤q[159]≤−0.00082

−0.00845≤q[160]≤−0.00843

−0.01598≤q[161]≤−0.01596

−0.02345≤q[162]≤−0.02343

−0.03085≤q[163]≤−0.03083

−0.03819≤q[164]≤−0.03817

−0.04547≤q[165]≤−0.04545

−0.05269≤q[166]≤−0.05267

−0.05984≤q[167]≤−0.05982

−0.06694≤q[168]≤−0.06692

−0.07397≤q[169]≤−0.07395

−0.08095≤q[170]≤−0.08093

−0.08786≤q[171]≤−0.08784

−0.09471≤q[172]≤−0.09469

−0.10149≤q[173]≤−0.10147

−0.10821≤q[174]≤−0.10819

−0.11486≤q[175]≤−0.11484

−0.12144≤q[176]≤−0.12142

−0.12794≤q[177]≤−0.12792

−0.13437≤q[178]≤−0.13435

−0.14071≤q[179]≤−0.14069

−0.14697≤q[180]≤−0.14695

−0.15313≤q[181]≤−0.15311

−0.15919≤q[182]≤−0.15917

−0.16514≤q[183]≤−0.16512

−0.17097≤q[184]≤−0.17095

−0.17668≤q[185]≤−0.17666

−0.18226≤q[186]≤−0.18224

−0.18768≤q[187]≤−0.18766

−0.19295≤q[188]≤−0.19293

−0.19804≤q[189]≤−0.19802

−0.20294≤q[190]≤−0.20292

−0.20764≤q[191]≤−0.20762.

14. Filter apparatus according to claim 10, wherein the intermediate filters are adapted, so that the real valued prototype filter coefficients q(v) for integer v in the range from 0 to 191 are given by q[0]=−0.2029343380 q[1]=−0.1980331588 q[2]=−0.1929411519 q[3]=−0.1876744222 q[4]=−0.1822474011 q[5]=−0.1766730202 q[6]=−0.1709628636 q[7]=−0.1651273005 q[8]=−0.1591756024 q[9]=−0.1531160455 q[10]=−0.1469560005 q[11]=−0.1407020132 q[12]=−0.1343598738 q[13]=−0.1279346790 q[14]=−0.1214308876 q[15]=−0.1148523686 q[16]=−0.1082024454 q[17]=−0.1014839341 q[18]=−0.0946991783 q[19]=−0.0878500799 q[20]=−0.0809381268 q[21]=−0.0739644174 q[22]=−0.0669296831 q[23]=−0.0598343081 q[24]=−0.0526783466 q[25]=−0.0454615388 q[26]=−0.0381833249 q[27]=−0.0308428572 q[28]=−0.0234390115 q[29]=−0.0159703957 q[30]=−0.0084353584 q[31]=−0.0008319956 q[32]=0.0068418435 q[33]=0.0145885527 q[34]=0.0224107648 q[35]=0.0303113495 q[36]=0.0382934126 q[37]=0.0463602959 q[38]=0.0545155789 q[39]=0.0627630810 q[40]=0.0711068657 q[41]=0.0795512453 q[42]=0.0881007879 q[43]=0.0967603259 q[44]=0.1055349658 q[45]=0.1144301000 q[46]=0.1234514222 q[47]=0.1326049434 q[48]=0.1418970123 q[49]=0.1513343370 q[50]=0.1609240126 q[51]=0.1706735517 q[52]=0.1805909194 q[53]=0.1906845753 q[54]=0.2009635191 q[55]=0.2114373458 q[56]=0.2221163080 q[57]=0.2330113868 q[58]=0.2441343742 q[59]=0.2554979664 q[60]=0.2671158700 q[61]=0.2790029236 q[62]=0.2911752349 q[63]=0.3036503350 q[64]=0.9025275713 q[65]=0.9103585196 q[66]=0.9176977825 q[67]=0.9245760683 q[68]=0.9310214581 q[69]=0.9370596739 q[70]=0.9427143143 q[71]=0.9480070606 q[72]=0.9529578566 q[73]=0.9575850672 q[74]=0.9619056158 q[75]=0.9659351065 q[76]=0.9696879297 q[77]=0.9731773547 q[78]=0.9764156119 q[79]=0.9794139640 q[80]=0.9821827692 q[81]=0.9847315377 q[82]=0.9870689790 q[83]=0.9892030462 q[84]=0.9911409728 q[85]=0.9928893067 q[86]=0.9944539395 q[87]=0.9958401318 q[88]=0.9970525352 q[89]=0.9980952118 q[90]=0.9989716504 q[91]=0.9996847806 q[92]=1.0002369837 q[93]=1.0006301028 q[94]=1.0008654482 q[95]=1.0009438063 q[96]=1.0008654482 q[97]=1.0006301028 q[98]=1.0002369837 q[99]=0.9996847806 q[100]=0.9989716504 q[101]=0.9980952118 q[102]=0.9970525352 q[103]=0.9958401318 q[104]=0.9944539395 q[105]=0.9928893067 q[106]=0.9911409728 q[107]=0.9892030462 q[108]=0.9870689790 q[109]=0.9847315377 q[110]=0.9821827692 q[111]=0.9794139640 q[112]=0.9764156119 q[113]=0.9731773547 q[114]=0.9696879297 q[115]=0.9659351065 q[116]=0.9619056158 q[117]=0.9575850672 q[118]=0.9529578566 q[119]=0.9480070606 q[120]=0.9427143143 q[121]=0.9370596739 q[122]=0.9310214581 q[123]=0.9245760683 q[124]=0.9176977825 q[125]=0.9103585196 q[126]=0.9025275713 q[127]=0.8941712974 q[128]=0.2911752349 q[129]=0.2790029236 q[130]=0.2671158700 q[131]=0.2554979664 q[132]=0.2441343742 q[133]=0.2330113868 q[134]=0.2221163080 q[135]=0.2114373458 q[136]=0.2009635191 q[137]=0.1906845753 q[138]=0.1805909194 q[139]=0.1706735517 q[140]=0.1609240126 q[141]=0.1513343370 q[142]=0.1418970123 q[143]=0.1326049434 q[144]=0.1234514222 q[145]=0.1144301000 q[146]=0.1055349658 q[147]=0.0967603259 q[148]=0.0881007879 q[149]=0.0795512453 q[150]=0.0711068657 q[151]=0.0627630810 q[152]=0.0545155789 q[153]=0.0463602959 q[154]=0.0382934126 q[155]=0.0303113495 q[156]=0.0224107648 q[157]=0.0145885527 q[158]=0.0068418435 q[159]=−0.0008319956 q[160]=−0.0084353584 q[161]=−0.0159703957
q[162]=−0.0234390115
q[163]=−0.0308428572
q[164]=−0.0381833249
q[165]=−0.0454615388
q[166]=−0.0526783466
q[167]=−0.0598343081
q[168]=−0.0669296831
q[169]=−0.0739644174
q[170]=−0.0809381268
q[171]=−0.0878500799
q[172]=−0.0946991783
q[173]=−0.1014839341
q[174]=−0.1082024454
q[175]=−0.1148523686
q[176]=−0.1214308876
q[177]=−0.1279346790
q[178]=−0.1343598738
q[179]=−0.1407020132
q[180]=−0.1469560005
q[181]=−0.1531160455
q[182]=−0.1591756024
q[183]=−0.1651273005
q[184]=−0.1709628636
q[185]=−0.1766730202
q[186]=−0.1822474011
q[187]=−0.1876744222
q[188]=−0.1929411519
q[189]=−0.1980331588
q[190]=−0.2029343380
q[191]=−0.2076267137.

15. Filter apparatus according to claim 1, wherein the filter characteristic is based on an HRTF filter characteristic.

16. Filter apparatus according to claim 1, wherein the complex analysis filter bank comprises a downsampler for each subband signal output by the complex analysis filter bank.

17. Filter apparatus according to claim 16, wherein the complex analysis filter bank is adapted to output L complex subband signals, wherein L is a positive integer greater than 1, and wherein each of the downsampler is adapted to downsample the subband signals by a factor of L.

18. Filter apparatus according to claim 1, wherein the complex analysis filter bank comprises a complex modulated filter for each complex subband signal based on a prototype filter.

19. Filter apparatus according to claim 1, wherein the complex synthesis filter bank comprises an upsampler for each of the subband signals.

20. Filter apparatus according to claim 19, wherein the complex synthesis filter bank is operative to synthesize L signals of the intermediate filters to obtain the time domain output signal, wherein L is a positive integer greater than 1, wherein the complex synthesis filter bank comprises L upsampler and wherein each of the upsampler is adapted for upsampling the output of the intermediate filters by a factor of L.

21. Filter apparatus according to claim 1, wherein the complex synthesis filter bank comprises for each subband signal an intermediate synthesis filter, wherein the complex synthesis filter bank comprises a real part extractor for each signal output by intermediate synthesis filters, and wherein the complex synthesis filter bank further comprises an adder for adding the output of each of a the real part extractor to obtain the time domain output signal.

22. Filter apparatus according to claim 1, wherein the complex synthesis filter bank comprises an intermediate synthesis filter for each of the subband signals output by the intermediate filters, wherein the complex synthesis filter bank further comprises an adder for summing up the outputs of each intermediate synthesis filters and wherein the complex synthesis filter bank further comprises a real part extractor for extracting a real valued signal as the time domain output signal from the output of the adder.

23. Filter apparatus according to claim 1, wherein the filter apparatus further comprises a gain adjuster for at least one subband signal or for at least one signal output by intermediate filter for adjusting the gain.

24. Filtering apparatus according to claim 1, wherein the filtering apparatus further comprises a further intermediate filter for filtering at least one of the complex valued subband signals or for filtering at least one of the signals output by one of the intermediate filters.

25. Filter generator for providing an intermediate filter definition signal, comprising:
a complex modulated filter bank for filtering an impulse response signal indicative of an amplitude/frequency filter characteristic in a time domain to obtain a plurality of complex valued subband signals as the intermediate filter definition signal,
wherein each complex valued subband signal of the complex modulated filter bank corresponds to an impulse response for an intermediate filter for a subband signal;
wherein at least one of the complex valued subband signals comprises at least two different non-vanishing values; and
wherein each complex valued subband signal is shorter than the impulse response signal,
wherein the complex modulated filter bank comprises a hardware implementation.

26. Filter generator according to claim 25, wherein the complex modulated filter bank is adapted for outputting at least one complex valued subband signal as a linear combination of at least two values of the impulse response signal.

27. Filter generator according to claim 25, wherein the complex modulated filter bank is adapted for filtering an impulse response signal of a non-uniform amplitude/frequency filter characteristic.

28. Filter generator according to claim 25, wherein the complex modulated filter bank is operative to filter the impulse response signal, and wherein the impulse response signal is based on a HRTF-related impulse response.

29. Filter generator according to claim 25, wherein the complex modulated filter bank is adapted to output L complex valued subband signals, wherein L is a positive integer greater than 1.

30. Filter generator according to claim 29, wherein the complex modulated filter bank is adapted for providing the L complex valued subband signals downsampled by a factor L.

31. Filter generator according to claim 29, wherein the complex modulated filter bank is adapted to output L=64 complex valued subband signals.

32. Filter generator according to claim 29, wherein the complex modulated filter bank is adapted to provide complex valued subband signals having values $g_n(k)$ based on the equation, $$g_n(k) = \sum_{v=-\infty}^{\infty} h(v+kL)q(v)\exp\left(-i\frac{\pi}{L}\left(n+\frac{1}{2}\right)v\right) \quad (12)$$

wherein n is an integer in the range from 0 to (L−1) indicating an index of the complex valued subband signal, wherein k and v are integers, wherein h(v) is the response of a filter having the filter characteristic, wherein π=3.1415926 . . . is the circular number, wherein i=√−1 is the complex unit, and wherein q(v) are filter taps of a real valued prototype filter.

33. Filter generator according to claim 29, wherein the complex modulated filter bank is adapted to provide complex valued subband signals having a value of $g_n(k)$ based on the equation $$g_n(l) = \sum_{v=0}^{191} \tilde{h}(v+64\cdot(l-2))\cdot q(v)\cdot \exp\left(-i\frac{\pi}{64}\left(n+\frac{1}{2}\right)(v-95)\right) \quad (20)$$

wherein $$\tilde{h}(v) = \begin{cases} h(v), & v = 0, 1, \ldots, N_h - 1, \\ 0, & \text{otherwise} \end{cases} \quad (18)$$

wherein $N_h$, is the length of the impulse response h(v) of a filter having the filter characteristic, wherein it =π3.1415926... is the circular number, wherein i=√−1 is the complex unit, and wherein q(v) are filter taps of a real valued prototype filter.

34. Filter generator according to claim 32, wherein the complex modulated filter bank is adapted so that the prototype filter taps q(v) fulfill for integers v from 0 to 191 the relations:

−0.204≦q[0]≦−0.202

−0.199≦q[1]≦−0.197

−0.194≦q[2]≦−0.192

−0.189≦q[3]≦−0.187

−0.183≦q[4]≦−0.181

−0.178≦q[5]≦−0.176

−0.172≦q[6]≦−0.170

−0.166≦q[7]≦−0.164

−0.160≦q[8]≦−0.158

−0.154≦q[9]≦−0.152

−0.148≦q[10]≦−0.146

−0.142≦q[11]≦−0.140

−0.135≦q[12]≦−0.133

−0.129≦q[13]≦−0.127

−0.122≦q[14]≦−0.120

−0.116≦q[15]≦−0.114

−0.109≦q[16]≦−0.107

−0.102≦q[17]≦−0.100

−0.096≦q[18]≦−0.094

−0.089≦q[19]≦−0.087

−0.082≦q[20]≦−0.080

−0.075≦q[21]≦−0.073

−0.068≦q[22]≦−0.066

−0.061≦q[23]≦−0.059

−0.054≦q[24]≦−0.052

−0.046≦q[25]≦−0.044

−0.039≦q[26]≦−0.037

−0.032≦q[27]≦−0.030

−0.024≦q[28]≦−0.022

−0.017≦q[29]≦−0.015

−0.009≦q[30]≦−−0.007

−0.002≦q[31]≦0.000

0.006≦q[32]≦0.008

0.014≦q[33]≦0.016

0.021≦q[34]≦0.023

0.029≦q[35]≦0.031

0.037≦q[36]≦0.039

0.045≦q[37]≦0.047

0.054≦q[38]≦0.056

0.062≦q[39]≦0.064

0.070≦q[40]≦0.072

0.079≦q[41]≦0.081

0.087≦q[42]≦0.089

0.096≦q[43]≦0.098

$0.105 \leq q[44] \leq 0.107$ $0.113 \leq q[45] \leq 0.115$ $0.122 \leq q[46] \leq 0.124$ $0.132 \leq q[47] \leq 0.134$ $0.141 \leq q[48] \leq 0.143$ $0.150 \leq q[49] \leq 0.152$ $0.160 \leq q[50] \leq 0.162$ $0.170 \leq q[51] \leq 0.172$ $0.180 \leq q[52] \leq 0.182$ $0.190 \leq q[53] \leq 0.192$ $0.200 \leq q[54] \leq 0.202$ $0.210 \leq q[55] \leq 0.212$ $0.221 \leq q[56] \leq 0.223$ $0.232 \leq q[57] \leq 0.234$ $0.243 \leq q[58] \leq 0.245$ $0.254 \leq q[59] \leq 0.256$ $0.266 \leq q[60] \leq 0.268$ $0.278 \leq q[61] \leq 0.280$ $0.290 \leq q[62] \leq 0.292$ $0.303 \leq q[63] \leq 0.305$ $0.902 \leq q[64] \leq 0.904$ $0.909 \leq q[65] \leq 0.911$ $0.917 \leq q[66] \leq 0.919$ $0.924 \leq q[67] \leq 0.926$ $0.930 \leq q[68] \leq 0.932$ $0.936 \leq q[69] \leq 0.938$ $0.942 \leq q[70] \leq 0.944$ $0.947 \leq q[71] \leq 0.949$ $0.952 \leq q[72] \leq 0.954$ $0.957 \leq q[73] \leq 0.959$ $0.961 \leq q[74] \leq 0.963$ $0.965 \leq q[75] \leq 0.967$ $0.969 \leq q[76] \leq 0.971$ $0.972 \leq q[77] \leq 0.974$ $0.975 \leq q[78] \leq 0.977$ $0.978 \leq q[79] \leq 0.980$ $0.981 \leq q[80] \leq 0.983$ $0.984 \leq q[81] \leq 0.986$ $0.986 \leq q[82] \leq 0.988$ $0.988 \leq q[83] \leq 0.990$ $0.990 \leq q[84] \leq 0.992$ $0.992 \leq q[85] \leq 0.994$ $0.993 \leq q[86] \leq 0.995$ $0.995 \leq q[87] \leq 0.997$ $0.996 \leq q[88] \leq 0.998$ $0.997 \leq q[891] \leq 0.999$ $0.998 \leq q[90] \leq 1.000$ $0.999 \leq q[91] \leq 1.001$ $0.999 \leq q[92] \leq 1.001$ $1.000 \leq q[93] \leq 1.002$ $1.000 \leq q[94] \leq 1.002$ $1.000 \leq q[95] \leq 1.002$ $1.000 \leq q[96] \leq 1.002$ $1.000 \leq q[97] \leq 1.002$ $0.999 \leq q[98] \leq 1.001$ $0.999 \leq q[99] \leq 1.001$ $0.998 \leq q[100] \leq 1.000$ $0.997 \leq q[101] \leq 0.999$ $0.996 \leq q[102] \leq 0.998$ $0.995 \leq q[103] \leq 0.997$ $0.993 \leq q[104] \leq 0.995$ $0.992 \leq q[105] \leq 0.994$ $0.990 \leq q[106] \leq 0.992$ $0.988 \leq q[107] \leq 0.990$ $0.986 \leq q[108] \leq 0.988$ $0.984 \leq q[109] \leq 0.986$ $0.981 \leq q[110] \leq 0.983$ $0.978 \leq q[111] \leq 0.980$ $0.975 \leq q[112] \leq 0.977$ $0.972 \leq q[113] \leq 0.974$ $0.969 \leq q[114] \leq 0.971$ $0.965 \leq q[115] \leq 0.967$ $0.961 \leq q[116] \leq 0.963$ $0.957 \leq q[117] \leq 0.959$ 0.952≤q[118]≤0.954

0.947≤q[119]≤0.949

0.942≤q[120]≤0.944

0.936≤q[121]≤0.938

0.930≤q[122]≤0.932

0.924≤q[123]≤0.926

0.917≤q[124]≤0.919

0.909≤q[125]≤0.911

0.902≤q[126]≤0.904

0.893≤q[127]≤0.895

0.290≤q[128]≤0.292

0.278≤q[129]≤0.280

0.266≤q[130]≤0.268

0.254≤q[131]≤0.256

0.243≤q[132]≤0.245

0.232≤q[133]≤0.234

0.221≤q[134]≤0.223

0.210≤q[135]≤0.212

0.200≤q[136]≤0.202

0.190≤q[137]≤0.192

0.180≤q[138]≤0.182

0.170≤q[139]≤0.172

0.160≤q[140]≤0.162

0.150≤q[141]≤0.152

0.141≤q[142]≤0.143

0.132≤q[143]≤0.134

0.122≤q[144]≤0.124

0.113≤q[145]≤0.115

0.105≤q[146]≤0.107

0.096≤q[147]≤0.098

0.087≤q[148]≤0.089

0.079≤q[149]≤0.081

0.070≤q[150]≤0.072

0.062≤q[151]≤0.064

0.054≤q[152]≤0.056

0.045≤q[153]≤0.047

0.037≤q[154]≤0.039

0.029≤q[155]≤0.031

0.021≤q[156]≤0.023

0.014≤q[157]≤0.016

0.006≤q[158]≤0.008

−0.002≤q[159]≤0.000

−0.009≤q[160]≤−0.007

−0.017≤q[161]≤−0.015

−0.024≤q[162]≤−0.022

−0.032≤q[163]≤−0.030

−0.039≤q[164]≤−0.037

−0.046≤q[165]≤−0.044

−0.054≤q[166]≤−0.052

−0.061≤q[167]≤−0.059

−0.068≤q[168]≤−0.066

−0.075≤q[169]≤−0.073

−0.082≤q[170]≤−0.080

−0.089≤q[171]≤−0.087

−0.096≤q[172]≤−0.094

−0.102≤q[173]≤−0.100

−0.109≤q[174]≤−0.107

−0.116≤q[175]≤−0.114

−0.122≤q[176]≤−0.120

−0.129≤q[177]≤−0.127

−0.135≤q[178]≤−0.133

−0.142≤q[179]≤−0.140

−0.148≤q[180]≤−0.146

−0.154≤q[181]≤−0.152

−0.160≤q[182]≤−0.158

−0.166≤q[183]≤−0.164

−0.172≤q[184]≤−0.170

−0.178≤q[185]≤−0.176

−0.183≤q[186]≤−0.181

−0.189≤q[187]≤−0.187

−0.194≤q[188]≤−0.192

−0.199≤q[189]≤−0.197

−0.204≤q[190]≤−0.202

−0.209≤q[191]≤−0.207.

35. Filter generator according to claim 32, wherein the complex modulated filter bank is adapted so that the prototype filter q(v) fulfils for integers v from 0 to 191 the relations:

$-0.20294 \leq q[0] \leq -0.20292$ $-0.19804 \leq q[1] \leq -0.19802$ $-0.19295 \leq q[2] \leq -0.19293$ $-0.18768 \leq q[3] \leq -0.18766$ $-0.18226 \leq q[4] \leq -0.18224$ $-0.17668 \leq q[5] \leq -0.17666$ $-0.17097 \leq q[6] \leq -0.17095$ $-0.16514 \leq q[7] \leq -0.16512$ $-0.15919 \leq q[8] \leq -0.15917$ $-0.15313 \leq q[9] \leq -0.15311$ $-0.14697 \leq q[10] \leq -0.14695$ $-0.14071 \leq q[11] \leq -0.14069$ $-0.13437 \leq q[12] \leq -0.13435$ $-0.12794 \leq q[13] \leq -0.12792$ $-0.12144 \leq q[14] \leq -0.12142$ $-0.11486 \leq q[15] \leq -0.11484$ $-0.10821 \leq q[16] \leq -0.10819$ $-0.10149 \leq q[17] \leq -0.10147$ $-0.09471 \leq q[18] \leq -0.09469$ $-0.08786 \leq q[19] \leq -0.08784$ $-0.08095 \leq q[20] \leq -0.08093$ $-0.07397 \leq q[21] \leq -0.07395$ $-0.06694 \leq q[22] \leq -0.06692$ $-0.05984 \leq q[23] \leq -0.05982$ $-0.05269 \leq q[24] \leq 0.05267$ $-0.04547 \leq q[25] \leq -0.04545$ $-0.03819 \leq q[26] \leq -0.03817$ $-0.03085 \leq q[27] \leq -0.03083$ $-0.02345 \leq q[28] \leq -0.02343$ $-0.01598 \leq q[29] \leq -0.01596$ $-0.00845 \leq q[30] \leq -0.00843$ $-0.00084 \leq q[31] \leq -0.00082$ $0.00683 \leq q[32] \leq 0.00685$ $0.01458 \leq q[33] \leq 0.01460$ $0.02240 \leq q[34] \leq 0.02242$ $0.03030 \leq q[35] \leq 0.03032$ $0.03828 \leq q[36] \leq 0.03830$ $0.04635 \leq q[37] \leq 0.04637$ $0.05451 \leq q[38] \leq 0.05453$ $0.06275 \leq q[39] \leq 0.06277$ $0.07110 \leq q[40] \leq 0.07112$ $0.07954 \leq q[41] \leq 0.07956$ $0.08809 \leq q[42] \leq 0.08811$ $0.09675 \leq q[43] \leq 0.09677$ $0.10552 \leq q[44] \leq 0.10554$ $0.11442 \leq q[45] \leq 0.11444$ $0.12344 \leq q[46] \leq 0.12346$ $0.13259 \leq q[47] \leq 0.13261$ $0.14189 \leq q[48] \leq 0.14191$ $0.15132 \leq q[49] \leq 0.15134$ $0.16091 \leq q[50] \leq 0.16093$ $0.17066 \leq q[51] \leq 0.17068$ $0.18058 \leq q[52] \leq 0.18060$ $0.19067 \leq q[53] \leq 0.19069$ $0.20095 \leq q[54] \leq 0.20097$ $0.21143 \leq q[55] \leq 0.21145$ $0.22211 \leq q[56] \leq 0.22213$ $0.23300 \leq q[57] \leq 0.23302$ $0.24412 \leq q[58] \leq 0.24414$ $0.25549 \leq q[59] \leq 0.25551$ $0.26711 \leq q[60] \leq 0.26713$ $0.27899 \leq q[61] \leq 0.27901$ $0.29117 \leq q[62] \leq 0.29119$ $0.30364 \leq q[63] \leq 0.30366$ $0.90252 \leq q[64] \leq 0.90254$ $0.91035 \leq q[65] \leq 0.91037$ $0.91769 \leq q[66] \leq 0.91771$ $0.92457 \leq q[67] \leq 0.92459$ $0.93101 \leq q[68] \leq 0.93103$ $0.93705 \leq q[69] \leq 0.93707$ $0.94270 \leq q[70] \leq 0.94272$ $0.94800 \leq q[71] \leq 0.94802$ $0.95295 \leq q[72] \leq 0.95297$ $0.95758 \leq q[73] \leq 0.95760$ $0.96190 \leq q[74] \leq 0.96192$ $0.96593 \leq q[75] \leq 0.96595$ $0.96968 \leq q[76] \leq 0.96970$ $0.97317 \leq q[77] \leq 0.97319$ $0.97641 \leq q[78] \leq 0.97643$ $0.97940 \leq q[79] \leq 0.97942$ $0.98217 \leq q[80] \leq 0.98219$ $0.98472 \leq q[81] \leq 0.98474$ $0.98706 \leq q[82] \leq 0.98708$ $0.98919 \leq q[83] \leq 0.98921$ $0.99113 \leq q[84] \leq 0.99115$ $0.99288 \leq q[85] \leq 0.99290$ $0.99444 \leq q[86] \leq 0.99446$ $0.99583 \leq q[87] \leq 0.99585$ $0.99704 \leq q[88] \leq 0.99706$ $0.99809 \leq q[89] \leq 0.99811$ $0.99896 \leq q[90] \leq 0.99898$ $0.99967 \leq q[91] \leq 0.99969$ $1.00023 \leq q[92] \leq 1.00025$ $1.00062 \leq q[93] \leq 1.00064$ $1.00086 \leq q[94] \leq 1.00088$ $1.00093 \leq q[95] \leq 1.00095$ $1.00086 \leq q[96] \leq 1.00088$ $1.00062 \leq q[97] \leq 1.00064$ $1.00023 \leq q[98] \leq 1.00025$ $0.99967 \leq q[99] \leq 0.99969$ $0.99896 \leq q[100] \leq 0.99898$ $0.99809 \leq q[101] \leq 0.99811$ $0.99704 \leq q[102] \leq 0.99706$ $0.99583 \leq q[103] \leq 0.99585$ $0.99444 \leq q[104] \leq 0.99446$ $0.99288 \leq q[105] \leq 0.99290$ $0.99113 \leq q[106] \leq 0.99115$ $0.98919 \leq q[107] \leq 0.98921$ $0.98706 \leq q[108] \leq 0.98708$ $0.98472 \leq q[109] \leq 0.98474$ $0.98217 \leq q[110] \leq 0.98219$ $0.97940 \leq q[111] \leq 0.97942$ $0.97641 \leq q[112] \leq 0.97643$ $0.97317 \leq q[113] \leq 0.97319$ $0.96968 \leq q[114] \leq 0.96970$ $0.96593 \leq q[115] \leq 0.96595$ $0.96190 \leq q[116] \leq 0.96192$ $0.95758 \leq q[117] \leq 0.95760$ $0.95295 \leq q[118] \leq 0.95297$ $0.94800 \leq q[119] \leq 0.94802$ $0.94270 \leq q[120] \leq 0.94272$ $0.93705 \leq q[121] \leq 0.93707$ $0.93101 \leq q[122] \leq 0.93103$ $0.92457 \leq q[123] \leq 0.92459$ $0.91769 \leq q[124] \leq 0.91771$ $0.91035 \leq q[125] \leq 0.91037$ $0.90252 \leq q[126] \leq 0.90254$ $0.89416 \leq q[127] \leq 0.89418$ $0.29117 \leq q[128] \leq 0.29119$ $0.27899 \leq q[129] \leq 0.27901$ $0.26711 \leq q[130] \leq 0.26713$ $0.25549 \leq q[131] \leq 0.25551$ $0.24412 \leq q[132] \leq 0.24414$ $0.23300 \leq q[133] \leq 0.23302$ $0.22211 \leq q[134] \leq 0.22213$ $0.21143 \leq q[135] \leq 0.21145$ $0.20095 \leq q[136] \leq 0.20097$ $0.19067 \leq q[137] \leq 0.19069$ $0.18058 \leq q[138] \leq 0.18060$ $0.17066 \leq q[139] \leq 0.17068$ $0.16091 \leq q[140] \leq 0.16093$ $0.15132 \leq q[141] \leq 0.15134$ $0.14189 \leq q[142] \leq 0.14191$ $0.13259 \leq q[143] \leq 0.13261$ $0.12344 \leq q[144] \leq 0.12346$ $0.11442 \leq q[145] \leq 0.11444$ $0.10552 \leq q[146] \leq 0.10554$ $0.09675 \leq q[147] \leq 0.09677$ $0.08809 \leq q[148] \leq 0.08811$ $0.07954 \leq q[149] \leq 0.07956$ $0.07110 \leq q[150] \leq 0.07112$ $0.06275 \leq q[151] \leq 0.06277$ $0.05451 \leq q[152] \leq 0.05453$ $0.04635 \leq q[153] \leq 0.04637$ $0.03828 \leq q[154] \leq 0.03830$ $0.03030 \leq q[155] \leq 0.03032$ $0.02240 \leq q[156] \leq 0.02242$ $0.01458 \leq q[157] \leq 0.01460$ $0.00683 \leq q[158] \leq 0.00685$ $-0.00084 \leq q[159] \leq -0.00082$ $-0.00845 \leq q[160] \leq -0.00843$ $-0.01598 \leq q[161] \leq -0.01596$ $-0.02345 \leq q[162] \leq -0.02343$ $-0.03085 \leq q[163] \leq -0.03083$ $-0.03819 \leq q[164] \leq -0.03817$ $-0.04547 \leq q[165] \leq -0.04545$ $-0.05269 \leq q[166] \leq -0.05267$ $-0.05984 \leq q[167] \leq -0.05982$ $-0.06694 \leq q[168] \leq -0.06692$ $-0.07397 \leq q[169] \leq -0.07395$ $-0.08095 \leq q[170] \leq -0.08093$ $-0.08786 \leq q[171] \leq -0.08784$ $-0.09471 \leq q[172] \leq -0.09469$ $-0.10149 \leq q[173] \leq -0.10147$ $-0.10821 \leq q[174] \leq -0.10819$ $-0.11486 \leq q[175] \leq -0.11484$ $-0.12144 \leq q[176] \leq -0.12142$ $-0.12794 \leq q[177] \leq -0.12792$ $-0.13437 \leq q[178] \leq -0.13435$ $-0.14071 \leq q[179] \leq -0.14069$ $-0.14697 \leq q[180] \leq -0.14695$ $-0.15313 \leq q[181] \leq -0.15311$ $-0.15919 \leq q[182] \leq -0.15917$ $-0.16514 \leq q[183] \leq -0.16512$ $-0.17097 \leq q[184] \leq -0.17095$ $-0.17668 \leq q[185] \leq -0.17666$ $-0.18226 \leq q[186] \leq -0.18224$ $-0.18768 \leq q[187] \leq -0.18766$ $-0.19295 \leq q[188] \leq -0.19293$ $-0.19804 \leq q[189] \leq -0.19802$ $-0.20294 \leq q[190] \leq -0.20292$ $-0.20764 \leq q[191] \leq -0.20762$.

36. Filter generator according to claim 32, wherein the complex modulated filter bank is adapted so that the real valued prototype filter coefficients q(v) for integer v in the range from 0 to 191 are given by $q[0]=-0.2029343380$ $q[1]=-0.1980331588$ $q[2]=-0.1929411519$ $q[3]=-0.1876744222$ $q[4]=-0.1822474011$ $q[5]=-0.1766730202$ $q[6]=-0.1709628636$ $q[7]=-0.1651273005$ $q[8]=-0.1591756024$ $q[9]=-0.1531160455$ $q[10]=-0.1469560005$ $q[11]=-0.1407020132$ $q[12]=-0.1343598738$ $q[13]=-0.1279346790$ $q[14]=-0.1214308876$ $q[15]=-0.1148523686$ $q[16]=-0.1082024454$ $q[17]=-0.1014839341$ $q[18]=-0.0946991783$ $q[19]=-0.0878500799$ $q[20]=-0.0809381268$ $q[21] \leq -0.0739.644174$ $q[22]=-0.0669296831$ $q[23]=-0.0598343081$ $q[24]=-0.0526783466$ $q[25]=-0.0454615388$ q[26]=−0.0381833249
q[27]=−0.0308428572
q[28]=−0.0234390115
q[29]=−0.0159703957
q[30]=−0.0084353584
q[31]=−0.0008319956
q[32]=0.0068418435
q[33]=0.0145885527
q[34]=0.0224107648
q[35]=0.0303113495
q[36]=0.0382934126
q[37]=0.0463602959
q[38]=0.0545155789
q[39]=0.0627630810
q[40]=0.0711068657
q[41]=0.0795512453
q[42]=0.0881007879
q[43]=0.0967603259
q[44]=0.1055349658
q[45]=0.1144301000
q[46]=0.1234514222
q[47]=0.1326049434
q[48]=0.1418970123
q[49]=0.1513343370
q[50]=0.1609240126
q[51]=0.1706735517
q[52]=0.1805909194
q[53]=0.1906845753
q[54]=0.2009635191
q[55]=0.2114373458
q[56]=0.2221163080
q[57]=0.2330113868
q[58]=0.2441343742
q[59]=0.2554979664
q[60]=0.2671158700
q[61]=0.2790029236
q[62]=0.2911752349 q[63]=0.3036503350
q[64]=0.9025275713
q[65]=0.9103585196
q[66]=0.9176977825
q[67]=0.9245760683
q[68]=0.9310214581
q[69]=0.9370596739
q[70]=0.9427143143
q[71]=0.9480070606
q[72]=0.9529578566
q[73]=0.9575850672
q[74]=0.9619056158
q[75]=0.9659351065
q[76]=0.9696879297
q[77]=0.9731773547
q[78]=0.9764156119
q[79]=0.9794139640
q[80]=0.9821827692
q[81]=0.9847315377
q[82]=0.9870689790
q[83]=0.9892030462
q[84]=0.9911409728
q[85]=0.9928893067
q[86]=0.9944539395
q[87]=0.9958401318
q[88]=0.9970525352
q[89]=0.9980952118
q[90]=0.9989716504
q[91]=0.9996847806
q[92]=1.0002369837
q[93]=1.0006301028
q[94]=1.0008654482
q[95]=1.0009438063
q[96]=1.0008654482
q[97]=1.0006301028
q[98]=1.0002369837
q[99]=0.9996847806 q[100]=0.9989716504 q[101]=0.9980952118 q[102]=0.9970525352 q[103]=0.9958401318 q[104]=0.9944539395 q[105]=0.9928893067 q[106]=0.9911409728 q[107]=0.9892030462 q[108]=0.9870689790 q[109]=0.9847315377 q[110]=0.9821827692 q[111]=0.9794139640 q[112]=0.9764156119 q[113]=0.9731773547 q[114]=0.9696879297 q[115]=0.9659351065 q[116]=0.9619056158 q[117]=0.9575850672 q[118]=0.9529578566 q[119]=0.9480070606 q[120]=0.9427143143 q[121]=0.9370596739 q[122]=0.9310214581 q[123]=0.9245760683 q[124]=0.9176977825 q[125]=0.9103585196 q[126]=0.9025275713 q[127]=0.8941712974 q[128]=0.2911752349 q[129]=0.2790029236 q[130]=0.2671158700 q[131]=0.2554979664 q[132]=0.2441343742 q[133]=0.2330113868 q[134]=0.2221163080 q[135]=0.2114373458 q[136]=0.2009635191 q[137]=0.1906845753 q[138]=0.1805909194 q[139]=0.1706735517 q[140]=0.1609240126 q[141]=0.1513343370 q[142]=0.1418970123 q[143]=0.1326049434 q[144]=0.1234514222 q[145]=0.1144301000 q[146]=0.1055349658 q[147]=0.0967603259 q[148]=0.0881007879 q[149]=0.0795512453 q[150]=0.0711068657 q[151]=0.0627630810 q[152]=0.0545155789 q[153]=0.0463602959 q[154]=0.0382934126 q[155]=0.0303113495 q[156]=0.0224107648 q[157]=0.0145885527 q[158]=0.0068418435 q[159]=−0.0008319956 q[160]≦−0.0084353584 q[161]≦−0.0159703957 q[162]=−0.0234390115 q[163]=−0.0308428572 q[164]=−0.0381833249 q[165]=−0.0454615388 q[166]=−0.0526783466 q[167]=−0.0598343081 q[168]=−0.0669296831 q[169]=−0.0739644174 q[170]=−0.0809381268 q[171]=−0.0878500799 q[172]=−0.0946991783 q[173]=−0.1014839341 q[174]=−0.1082024454 q[175]=−0.1148523686 q[176]=−0.1214308876 q[177]=−0.1279346790 q[178]=−0.1343598738 q[179]=−0.1407020132 q[180]=−0.1469560005 q[181]=−0.1531160455 q[182]=−0.1591756024 q[183]=−0.1651273005 q[184]=−0.1709628636 q[185]=−0.1766730202 q[186]=−0.1822474011 q[187]=−0.1876744222 q[188]=−0.1929411519 q[189]=−0.1980331588 q[190]=−0.2029343380 q[191]=−0.2076267137.

37. Filter generator according to claim 25, wherein the complex modulated filter bank further comprises a gain adjuster for adjusting at least one complex valued subband signal with respect to its value before outputting the gain adjusted complex valued subband signal as the intermediate filter definition signal.

38. Filter generator according to claim 25, wherein the complex modulated filter bank further comprises an impulse response generator for generating the impulse response signal based on a filter definition signal provided to the filter generator, wherein the impulse response signal output by the impulse response generator is provided to the complex modulated filter bank.

39. Filter generator according to claim 38, wherein the impulse response generator is adapted for generating the impulse response signal based on at least one of an amplitude/frequency filter characteristic, a phase/frequency filter characteristic and a signal comprising a set of filter taps indicative of the amplitude/frequency filter characteristic in the time domain as a filter definition signal.

40. Filter system for filtering a time domain input signal to obtain time domain output signal, comprising:
a filter apparatus for filtering the time domain input signal to obtain the time domain output signal, which is a representation of the time domain input signal filtered using a filter characteristic having an non-uniform amplitude/frequency characteristic, comprising:
a complex analysis filter bank for generating a plurality of complex subband signals from the time domain input signals;
a plurality of intermediate filters, wherein at least one of the intermediate filters of the plurality of the intermediate filters has a non-uniform amplitude/frequency characteristic, wherein the plurality of intermediate filters have a shorter impulse response compared to an impulse response of a filter having the filter characteristic, and wherein the non-uniform amplitude/frequency characteristics of the plurality of intermediate filters together represent the non-uniform filter characteristic; and
a complex synthesis filter bank for synthesizing the output of the intermediate filters to obtain the time domain output signal; and
a filter generator for providing an intermediate filter definition signal, comprising:
a complex modulated filter bank for filtering an impulse response signal indicative of an amplitude/frequency filter characteristic in a time domain to obtain a plurality of complex valued subband signals as the intermediate filter definition signal,
wherein each complex valued subband signal of the complex modulated filter bank corresponds to an impulse response for an intermediate filter for a subband signal;
wherein at least one of the complex valued subband signals comprises at least two different non-vanishing values; and
wherein each complex valued subband signal is shorter than the impulse response signal,
wherein the filter generator is coupled to the filter apparatus to provide the plurality of the intermediate filters with an intermediate filter definition; and
wherein the plurality of intermediate filters of the filter apparatus are adapted to have impulse responses based on the intermediate filter definition signal,
wherein at least one of the complex analysis filter bank, an intermediate filter of the plurality of intermediate filters, the complex synthesis filter bank, and the complex modulated filter bank comprises a hardware implementation.

41. Method for filtering a time domain input signal to obtain a time domain output signal, which is a representation of the time domain input signal filtered using a filter characteristic having a non-uniform amplitude/frequency characteristic, comprising:
generating a plurality of complex subband signals based on a complex filtering of the time domain input signal;
filtering each of the complex subband signals, wherein at least one of the complex subband signals is filtered using an non-uniform amplitude/frequency characteristic, wherein each of the subband signals is filtered based on an impulse response being shorter than the impulse response of a filter having the filter characteristic, and wherein the non-uniform amplitude/frequency characteristic of the impulse responses used for filtering the plurality of subband signals together represent the non-uniform filter characteristic; and
synthesizing from the output of the filtering of the complex subband signals the time domain output signal.

42. Method for providing an intermediate filter definition signal, comprising:
filtering an impulse response signal indicative of an amplitude/frequency filter characteristic in a time domain to obtain a plurality of complex valued subband signals as the intermediate filter definition signal,
wherein each complex valued subband signal corresponds to an impulse response for an intermediate filter for subband signal;
wherein at least one of the complex valued subband signals comprises at least two different non-vanishing values; and wherein each complex valued subband signal is shorter than the impulse response signal.

43. Non-transitory storage medium having stored thereon a computer program for performing, when running on a computer, a method for filtering the time domain input signal to obtain a time domain output signal, which is a representation of the time domain input signal filtered using a filter characteristic having a non-uniform amplitude/frequency characteristic, comprising:

generating a plurality of complex subband signals based on a complex filtering of the time domain input signal;

filtering each of the complex subband signals, wherein at least one of the complex subband signals is filtered using an non-uniform amplitude/frequency characteristic, wherein each of the subband signals is filtered based on an impulse response being shorter than the impulse response of a filter having the filter characteristic, and wherein the non-uniform amplitude/frequency characteristic of the impulse responses used for filtering the plurality of subband signals together represent the non-uniform filter characteristic; and synthesizing from the output of the filtering of the complex subband signals the time domain output signal.

44. Non-transitory storage medium having stored thereon a computer program for performing, when running on a computer, a method for providing an intermediate filter definition signal, comprising:

filtering an impulse response signal indicative of an amplitude/frequency filter characteristic in a time domain to obtain a plurality of complex valued subband signals as the intermediate filter definition signal, wherein each complex valued subband signal corresponds to an impulse response for an intermediate filter for subband signal;

wherein at least one of the complex valued subband signals comprises at least two different non-vanishing values; and wherein each complex valued subband signal is shorter than the impulse response signal.

* * * * *